United States Patent
Yingling et al.

(10) Patent No.: US 11,164,765 B2
(45) Date of Patent: Nov. 2, 2021

(54) MODULAR DIE HANDLING SYSTEM

(71) Applicant: Universal Instruments Corporation, Conklin, NY (US)

(72) Inventors: Michael Murray Yingling, Conklin, NY (US); Sean Michael Adams, Rochester, NY (US); David W. Lyndaker, Holley, NY (US); Scott C. Proctor, Brockport, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 210 days.

(21) Appl. No.: 16/315,283

(22) PCT Filed: Jul. 13, 2017

(86) PCT No.: PCT/US2017/041867
§ 371 (c)(1),
(2) Date: Jan. 4, 2019

(87) PCT Pub. No.: WO2018/013769
PCT Pub. Date: Jan. 18, 2018

(65) Prior Publication Data
US 2019/0252220 A1    Aug. 15, 2019

Related U.S. Application Data

(60) Provisional application No. 62/361,790, filed on Jul. 13, 2016.

(51) Int. Cl.
*H01L 21/00* (2006.01)
*H01L 21/67* (2006.01)
(Continued)

(52) U.S. Cl.
CPC ........ *H01L 21/67144* (2013.01); *H01L 21/50* (2013.01); *H01L 21/67288* (2013.01); *H01L 21/681* (2013.01); *H01L 22/12* (2013.01)

(58) Field of Classification Search
CPC ............... H01L 21/67144; H01L 21/50; H01L 21/67288; H01L 21/681; H01L 22/12
See application file for complete search history.

(56) References Cited

U.S. PATENT DOCUMENTS

| 3,300,063 A | 1/1967 | Jensen et al. |
| 3,975,888 A | 8/1976 | Jones |

(Continued)

FOREIGN PATENT DOCUMENTS

| JP | H0521598 A | 1/1993 |
| JP | H08148529 A | 6/1996 |

(Continued)

OTHER PUBLICATIONS

Application No. PCT/US2017/041867, International Search Report and the Written Opinion of the International Searching Authority, or the Declaration dated Sep. 21, 2017.

(Continued)

*Primary Examiner* — Victor A Mandala
*Assistant Examiner* — Colleen E Snow
(74) *Attorney, Agent, or Firm* — Schmeiser, Olsen & Watts, LLP

(57) ABSTRACT

Die handling systems and methods of use for preparing or processing dies from multiple types of pre-expanded wafer materials. The die handling systems are configured in a modular fashion, allowing for concurrent processes to expand the wafers, process the wafers, extract the dies, and inspect the extracted dies without forcing one of the processes of the system to remain idle. Embodiments of the wafer handler module include a mechanism, such as an expander capable of stretching or expanding wafers having one or more different sizes to a pre-expanded state without interrupting the die handler. The pre-expanded wafers are stored as a proprietary cartridge and delivered to the die (Continued)

handler, where a pick head of the die handler removes each die of the pre-expanded wafer and delivers the extracted dies to subsequent machinery, such as a pick and place machine, for further processing.

18 Claims, 26 Drawing Sheets

(51) Int. Cl.
*H01L 21/68* (2006.01)
*H01L 21/50* (2006.01)
*H01L 21/66* (2006.01)

(56) References Cited

U.S. PATENT DOCUMENTS

| | | | |
|---|---|---|---|
| 4,280,786 A | 7/1981 | Dyche | |
| 4,437,232 A | 3/1984 | Araki et al. | |
| 4,556,362 A | 12/1985 | Bahnck et al. | |
| 4,587,703 A | 5/1986 | Azizi et al. | |
| 4,758,127 A | 7/1988 | Imai et al. | |
| 4,876,791 A | 10/1989 | Michaud et al. | |
| 4,971,515 A | 11/1990 | Pol et al. | |
| 4,986,718 A | 1/1991 | Kumata et al. | |
| 5,040,291 A | 8/1991 | Janisiewicz et al. | |
| 5,105,528 A | 4/1992 | Soth et al. | |
| 5,201,696 A | 4/1993 | Kinback et al. | |
| 5,456,510 A | 10/1995 | Coots et al. | |
| 5,575,376 A | 11/1996 | Colamussi | |
| 5,596,270 A | 1/1997 | Mitsui | |
| 5,649,356 A | 7/1997 | Gieskes | |
| 5,649,804 A | 7/1997 | Schychuck | |
| 5,671,530 A | 9/1997 | Combs et al. | |
| 5,727,922 A | 3/1998 | Ikeya et al. | |
| 5,839,187 A | 11/1998 | Sato et al. | |
| 5,887,325 A | 3/1999 | Opfer | |
| 5,976,306 A | 11/1999 | Davis et al. | |
| 6,016,358 A | 1/2000 | Balamurugan | |
| 6,062,795 A | 5/2000 | Fuke et al. | |
| 6,132,161 A | 10/2000 | Shih et al. | |
| 6,173,750 B1 | 1/2001 | Davis et al. | |
| 6,256,869 B1 | 7/2001 | Asai et al. | |
| 6,289,579 B1 | 9/2001 | Viza et al. | |
| 6,439,631 B1 | 8/2002 | Kress | |
| 6,554,128 B1 | 4/2003 | Davis et al. | |
| 6,585,471 B2 | 7/2003 | Odajima et al. | |
| 6,752,581 B1 | 6/2004 | Lust et al. | |
| 6,773,543 B2 | 8/2004 | Summers | |
| 6,792,676 B2 | 9/2004 | Haji et al. | |
| 7,020,953 B2 | 4/2006 | Ueno et al. | |
| 7,137,195 B2 | 11/2006 | Haji et al. | |
| 7,207,430 B2 | 4/2007 | Davis et al. | |
| 7,275,314 B2 | 10/2007 | Yakiyama et al. | |
| 7,409,761 B2 | 8/2008 | Haji et al. | |
| 2001/0052392 A1 | 12/2001 | Nakmura et al. | |
| 2002/0003994 A1* | 1/2002 | Davis | H01L 21/67766 414/225.01 |
| 2002/0164241 A1 | 11/2002 | Anderson et al. | |
| 2005/0224186 A1 | 10/2005 | Sillner | |
| 2008/0105383 A1 | 5/2008 | Kubo et al. | |
| 2011/0038694 A1 | 2/2011 | Khoo | |
| 2011/0248738 A1 | 10/2011 | Sze et al. | |
| 2014/0299277 A1 | 10/2014 | Hosaka | |

FOREIGN PATENT DOCUMENTS

| | | |
|---|---|---|
| JP | H09199575 A | 7/1997 |
| KR | 1020090044342 | 5/2009 |
| KR | 1020100064189 | 6/2010 |
| WO | 2018/013769 A1 | 1/2018 |

OTHER PUBLICATIONS

Office Action in corresponding Swedish Patent Application No. 00049/19 dated Dec. 3, 2020. 8 pages.
Written Opinion in Singaporean Patent Application No. 11201900196P dated May 24, 2021. 6 pages.
Office Action in related Japanese Patent Application No. 2019-500650 dated Aug. 5, 2021. 5 pages.
Office Action in related Swiss Patent Application No. 00049/19 dated Aug. 9, 2021. 3 pages.

* cited by examiner

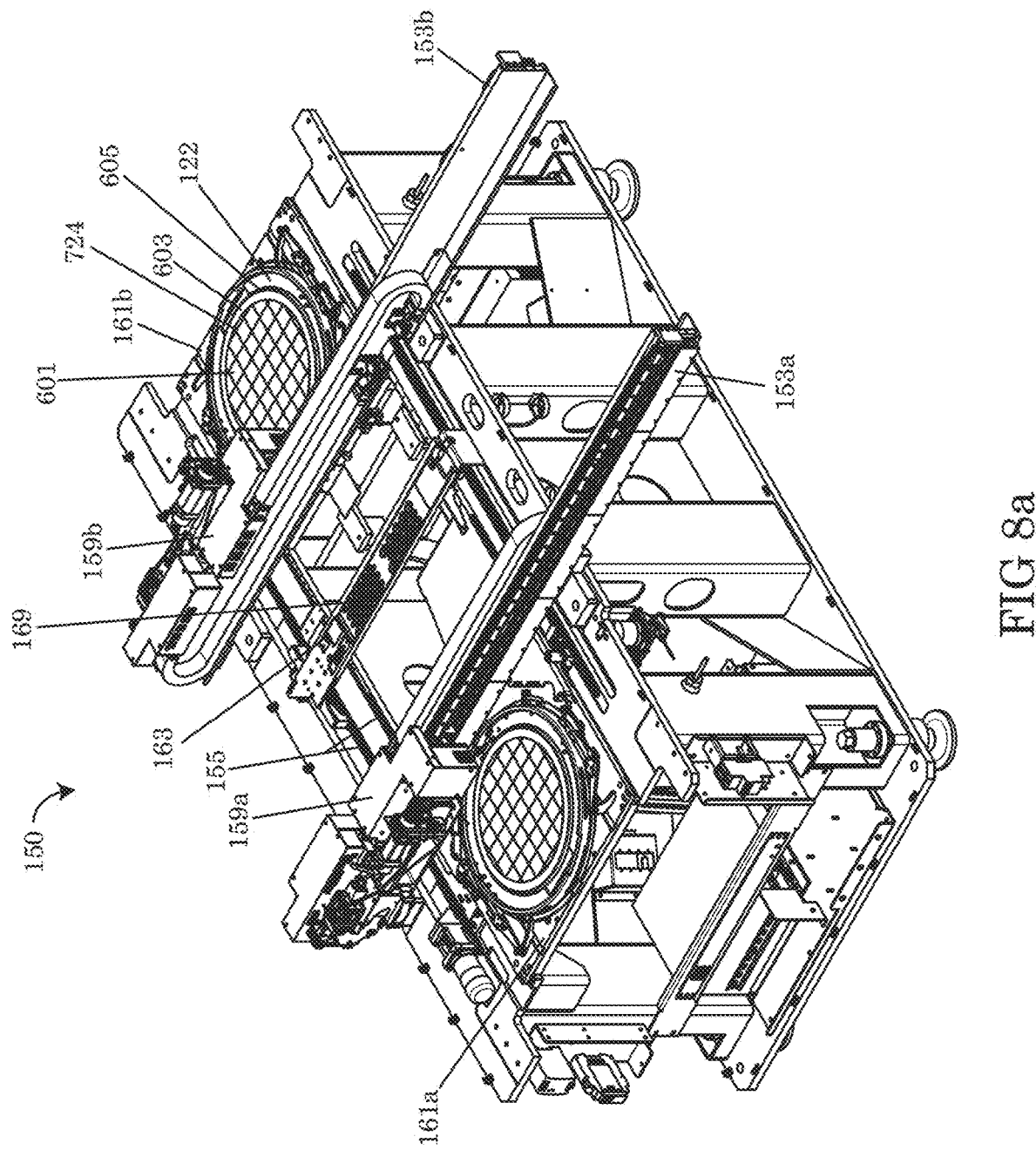

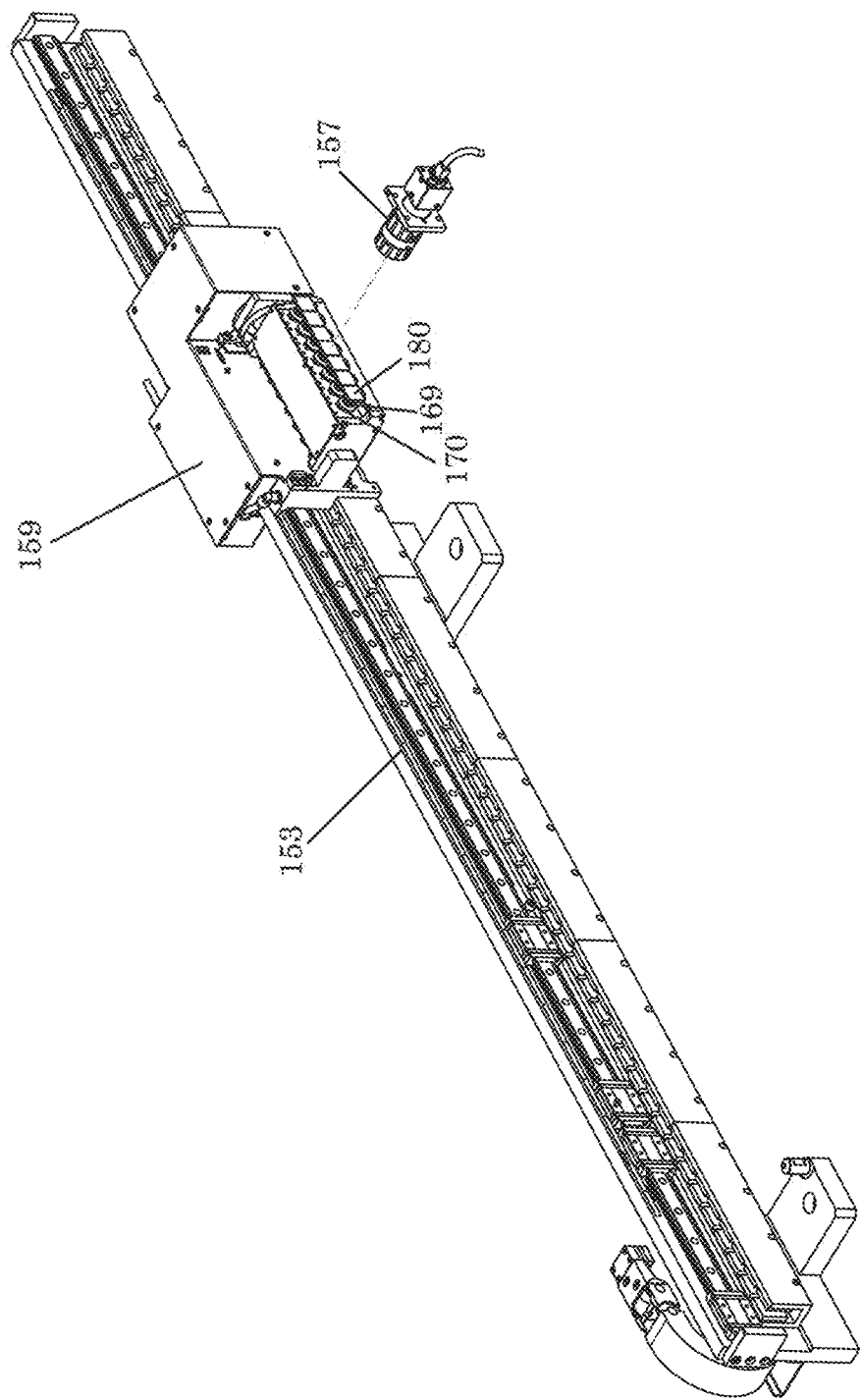

MODULAR DIE HANDLING SYSTEM

CROSS REFERENCE TO RELATED APPLICATIONS

This application is a National Stage entry of PCT Patent Application No. PCT/US2017/041867, filed Jul. 13, 2017, which claims priority to U.S. Provisional Patent Application No. 62/361,790 entitled "WAFER DIE HANDLING SYSTEM WITH A MODULAR EXPANSION SUBSYSTEM", filed Jul. 13, 2016, the entire contents of which are hereby incorporated by reference.

TECHNICAL FIELD

The subject matter herein relates to a die handling system and more specifically to die handling systems having a modular wafer handling subsystem.

BACKGROUND

Typically, a large number of integrated circuits are formed on a wafer, such as a silicon wafer. The silicon wafer is sliced into individual "semiconductor dies" (also referred to as "semiconductor chips") which are then packaged for use. A "semiconductor device package" typically includes a semiconductor die having a number of bond pads for the purpose of making electrical connections to the integrated circuitry of the die, and is mounted such that the bond pads are exposed. Bond pads, which provide input/output ("I/O") connections to a die, are typically placed along the edges of the die. Inner ends of conductive lines (also referred to as conductive traces, bond fingers, lead fingers or leads) are disposed around the periphery of the die such that they form an array of connection points surrounding the die. A die is typically mounted or attached in a die-receiving area of the semiconductor device package, that is, the area defined by the inner ends of the conductive lines.

Once the semiconductor die is attached, bond pads of a semiconductor die are connected to the connection points provided by the inner ends of conductive lines in one of several ways. Very thin bond wires, usually formed of aluminum or gold are often used to connect the connections points on a one-for-one basis with the bond pads on the semiconductor die. Tape-automated and solder bump bonding techniques have been employed to connect to the semiconductor die. Conductive lines extend outward from the die-receiving area, ultimately ending at the external pins of the semiconductor device package, for interfacing with external circuitry and providing electrical connection therewith. The semiconductor device package may be mounted in a socket on a circuit board, typically with additional components.

SUMMARY

A first embodiment of this disclosure relates generally to a die handling system comprising a first cassette configured to store wafers of a first size; an expander configured to expand the wafers of the first size into a first pre-expanded wafer; a pre-expanded wafer holding device configured to store the first pre-expanded wafer received from the expander; and a die handler comprising a pick head configured to extract one or more dies from the first pre-expanded wafer.

A second embodiment of this disclosure relates generally to a die handling method comprising the steps of loading a cassette with a wafer; pulling the wafer to an expander; expanding the wafer to a pre-expanded wafer; storing the pre-expanded wafer in a pre-expanded wafer holding device; pulling the pre-expanded wafer from the pre-expanded wafer holding device to a table of a die handler; and extracting one or more dies from of the pre-expanded wafer.

BRIEF DESCRIPTION OF THE DRAWINGS

Some of the embodiments will be described in detail with references made to the following figures, wherein like designations denote like members, wherein:

FIG. 2b depicts a top view of the embodiment of the wafer handling subsystem of FIG. 2a.

FIG. 2c depicts a front view of the embodiment of the wafer handling subsystem of FIG. 2a.

FIG. 4b depicts a top view of the expansion module of FIG. 4a.

FIG. 4c depicts a side view of the expansion module of FIG. 4a.

FIG. 4d depicts a front view of the expansion module of FIG. 4a.

FIG. 8a depicts an isometric view of an embodiment of a die handler.

FIG. 9a depicts an isometric view of an embodiment of a vision system inspecting one or more extracted dies.

FIG. 9b depicts a top view of the embodiment of the vision system of FIG. 9a.

FIG. 9c depicts a side view of the embodiment of the vision system of FIG. 9a.

DETAILED DESCRIPTION

Figure 1A:
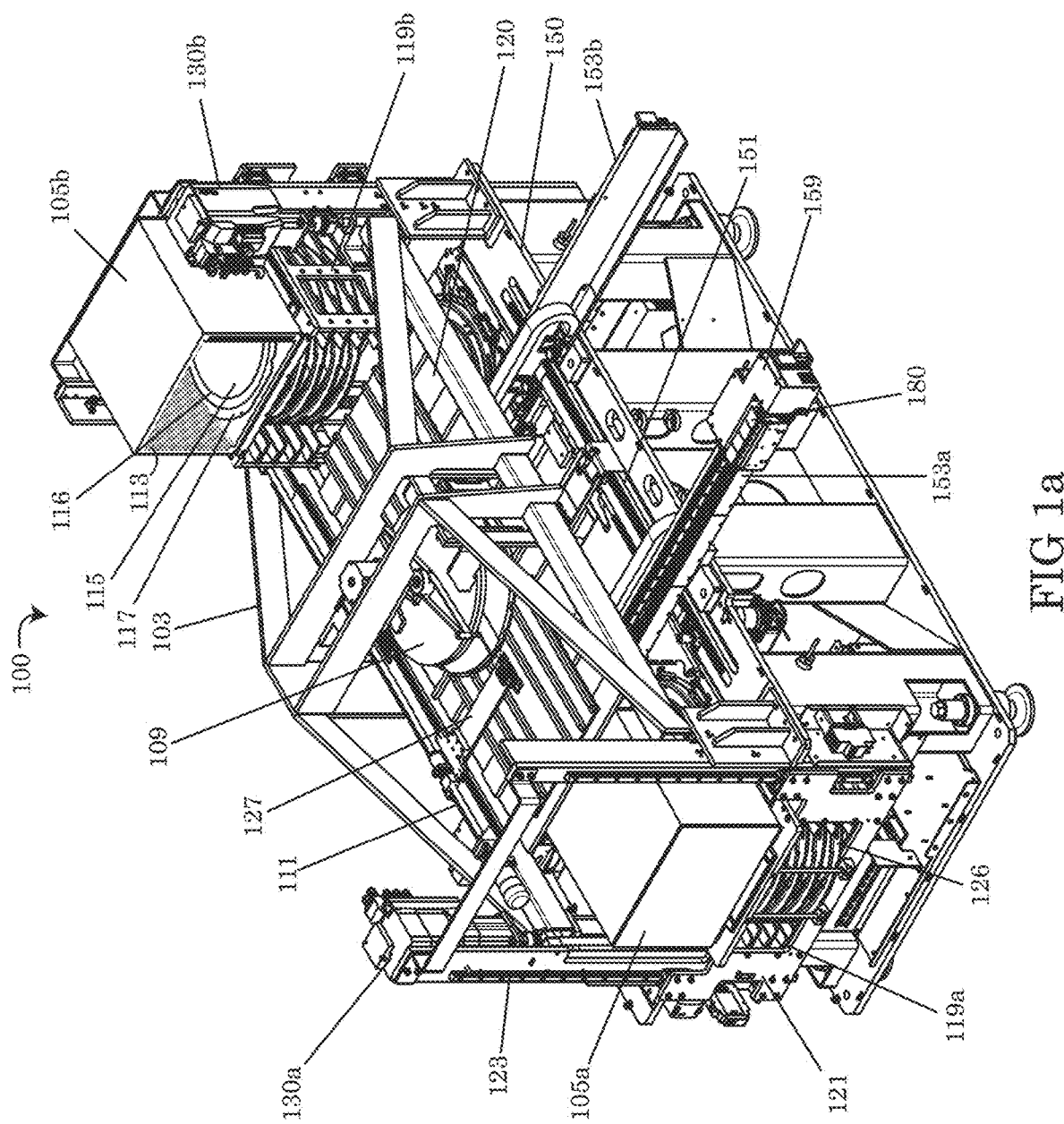
FIG. 1a depicts an isometric view of an embodiment of a die handling system having a modular wafer handling subsystem.

A detailed description of the hereinafter-described embodiments of the disclosed apparatus and method are presented herein by way of exemplification and not limitation with reference made to the Figures. Although certain embodiments are shown and described in detail, it should be understood that various changes and modifications might be made without departing from the scope of the appended claims. The scope of the present disclosure will in no way be limited to the number of constituting components, the materials thereof, the shapes thereof, colors thereof, the relative arrangement thereof, etc., and are disclosed simply as an example of embodiments of the present disclosure. A more complete understanding of the present embodiments and advantages thereof may be acquired by referring to the following description taken in conjunction with the accompanying drawings, in which like reference numbers indicate like features.

As a preface to the detailed description, it should be noted that, as used in this specification and the appended claims, the singular forms "a", "an" and "the" include plural referents, unless the context clearly dictates otherwise.

Overview

Currently available systems for handling wafers and dies consist of an expansion or stretch mechanism having a dedicated fixed frame size. These systems support a programmable, adjustable expansion or stretch distance of the wafers. However, these wafer handling systems typically work on a single wafer size at a time. If a different wafer sized is required to be processed, currently available wafer handling systems must put the first wafers through an un-stretching process, return the first wafers to a presentation area, configure the system to use a second wafer size and repeat the stretching process for the second set of wafers.

The currently available wafer handling systems have several disadvantages. For example, these systems require the wafers be processed serially. Serial processing limits the ability of the systems to process multiple wafers simultaneously. During the expansion or de-expansion of wafers, wafers cannot be processed and components cannot be simultaneously attached to the dies of the wafers. As a result, existing systems have to constantly run a stretching and un-stretching cycle which may increase the risk of material damage to the wafers being expanded. Moreover, currently available methods of processing wafers typically operate using a single wafer size at a time via a single dedicated delivery mode, to process wafers serially. In order to change materials and products, wafers may be expanded and unexpanded as needed. Even the newest wafer handling systems and die handler machines are non-modular. Wafer expansion in a serial system increases idle time as die extraction and die handling processes are halted when expansion is performed. The use of pre-expanded wafers requires significant hardware setup, and having variable wafer sizes requires a large amount of idle time and changeover of hardware when performed serially.

Embodiments of the die handling systems of the present disclosure address the shortcomings and disadvantages of previous wafer and die handling systems described above. The die handling systems of the present disclosure may prepare and extract dies from multiple types of wafer materials, without having to idle one or more sections of the die handler during wafer expansion. Wafer expansion processes and die extractions can occur concurrently with one another on the same system. Allowing for concurrent processes to expand the wafers, process the wafers, extract the dies and inspect the extracted dies without idling one or more processes being performed by the die handling system.

Embodiments of the die handler systems may include a wafer handling module subsystem capable of preparing pre-expanded wafers of various sizes and materials for storage and delivery to an attached die handler. Embodiments of the wafer handler module may include a mechanism, such as an expander, which may be able to stretch or expand the wafers having one or more different sizes to a pre-expanded state without interrupting the die handler. The pre-expanded wafers may be arranged as a cartridge comprising a wafer layered between two interlocking plates before being expanded by the expander. The pre-expanded wafers can be stored and delivered to the die handler as needed ensuring a steady stream of die extraction, without interruption or unnecessary idling.

Embodiments of the wafer handling module may include multiple cassettes loaded with wafers. Each cassette may be loaded with different types of wafer or wafers that may have different dimensions in some embodiments. Each cassette may be indexed to an expander of the wafer handling system. The expander and/or wafer table may pull the wafer of an appropriate size from a selected cassette, prepare the wafer of the appropriate size as a pre-expanded wafer inside a cartridge and temporarily store the cartridge in a pre-expanded wafer holding device prior to extraction of the dies. Each cartridge filling the pre-expanded wafer holding device may be considered "on deck" and ready to be selected by the die handler for die extraction via a pick head removing the dies from the pre-expanded wafer.

In the exemplary embodiment, the wafer handling system may have at least two cassettes acting as a delivery mechanism for prepared wafers of differing configurations, including different dimensions, materials, die sizes, thicknesses or circuitry loaded into each cassette. By having multiple cassettes filled with different prepared wafers of different configurations, the system may have a high flexibility for selecting input materials and handling modes. Different types of wafers and materials may be selected and pre-expanded ahead of the die handler pulling one or more pre-expanded wafers to the die handler's table and extracting the dies from the pre-expanded wafers via the pick head. Moreover, the wafer handling system may prepare and preemptively-store multiple pre-expanded wafers in each of the pre-expanded wafer holding devices. The wafer handling system may fill the pre-expanded wafer holding devices in anticipation of the pre-expanded wafers being processed.

Embodiments of the wafer handling system may pre-expand each of the types of prepared wafers, even while the die handler is concurrently processing one or more pre-expanded wafers that may have been removed from the pre-expanded wafer holding device, allowing for the wafer handling system to pre-expand wafers stored in each cassette while the die handling extracts dies from one or more pre-expanded wafer cartridges. Accordingly, the die handling system having a wafer handling module may continuously operate and process multiple different prepared wafer types with minimal or zero idle time caused by changeover of materials or changes to the operating modes, resulting in increased output of extracted dies.

Embodiments of the die handling system may further include a vision system comprising one or more cameras positioned in one or more positions throughout the die handling system. The vision system may provide visual data of each of the wafers during the expansion process via a camera positioned within view of wafer handling system and/or the expander of the wafer handling system. In some embodiments, the vision system may be positioned in-line of a pick head extracting the dies from each pre-expanded wafer, allowing for the vision system to inspect the dies as they are extracted from the wafer. Embodiments of the vision system may provide a three dimensional view of the wafer's dies as the pick head extracts the dies. Embodiments of the pick head may rotate the positioning of the extracted die, offering a three dimensional view of the extracted die the vision system.

Die Handling System

Figure 1B:
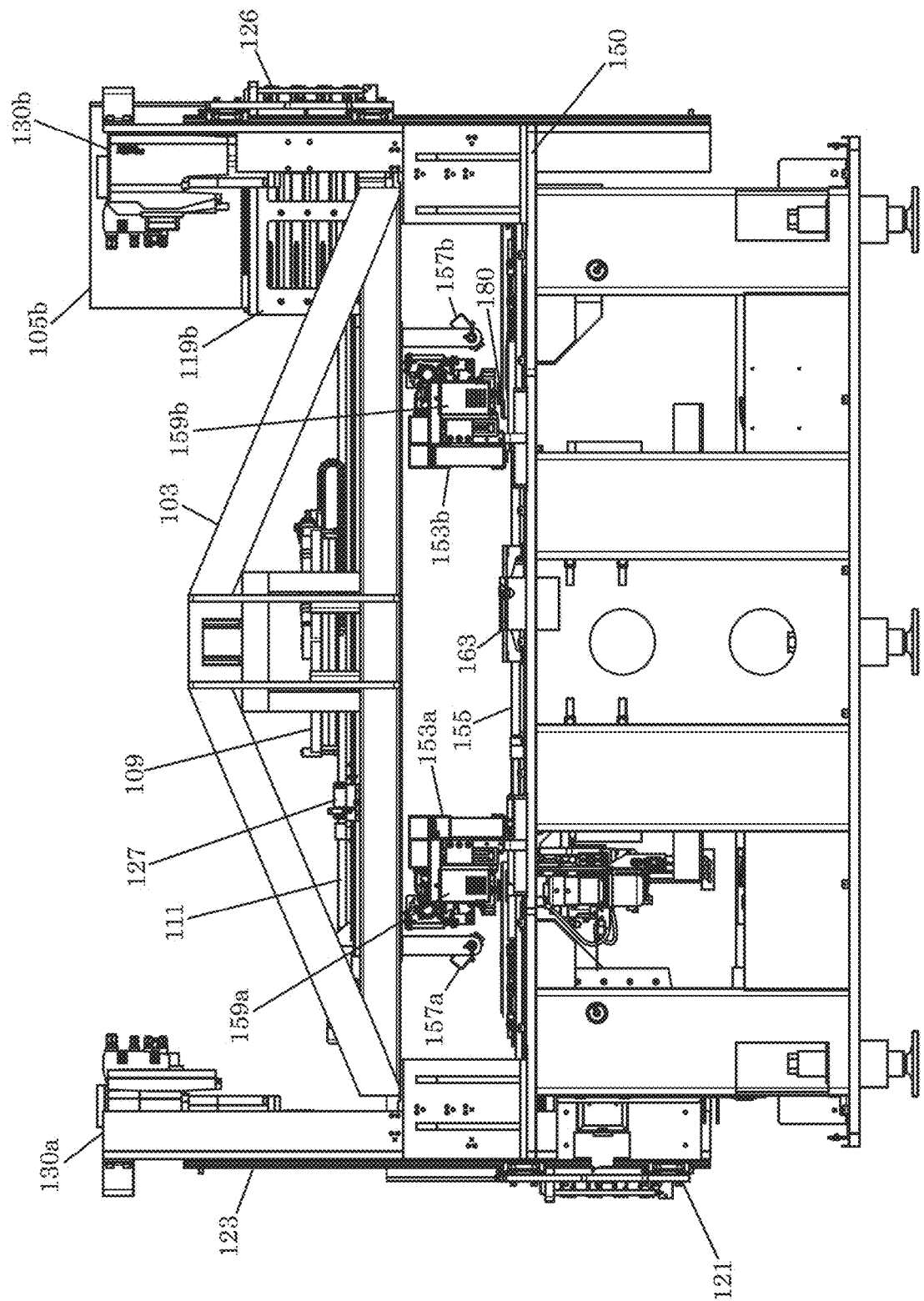
FIG. 1b depicts a front view of an embodiment of a die handling system having a modular wafer handling subsystem
Figure 2A:
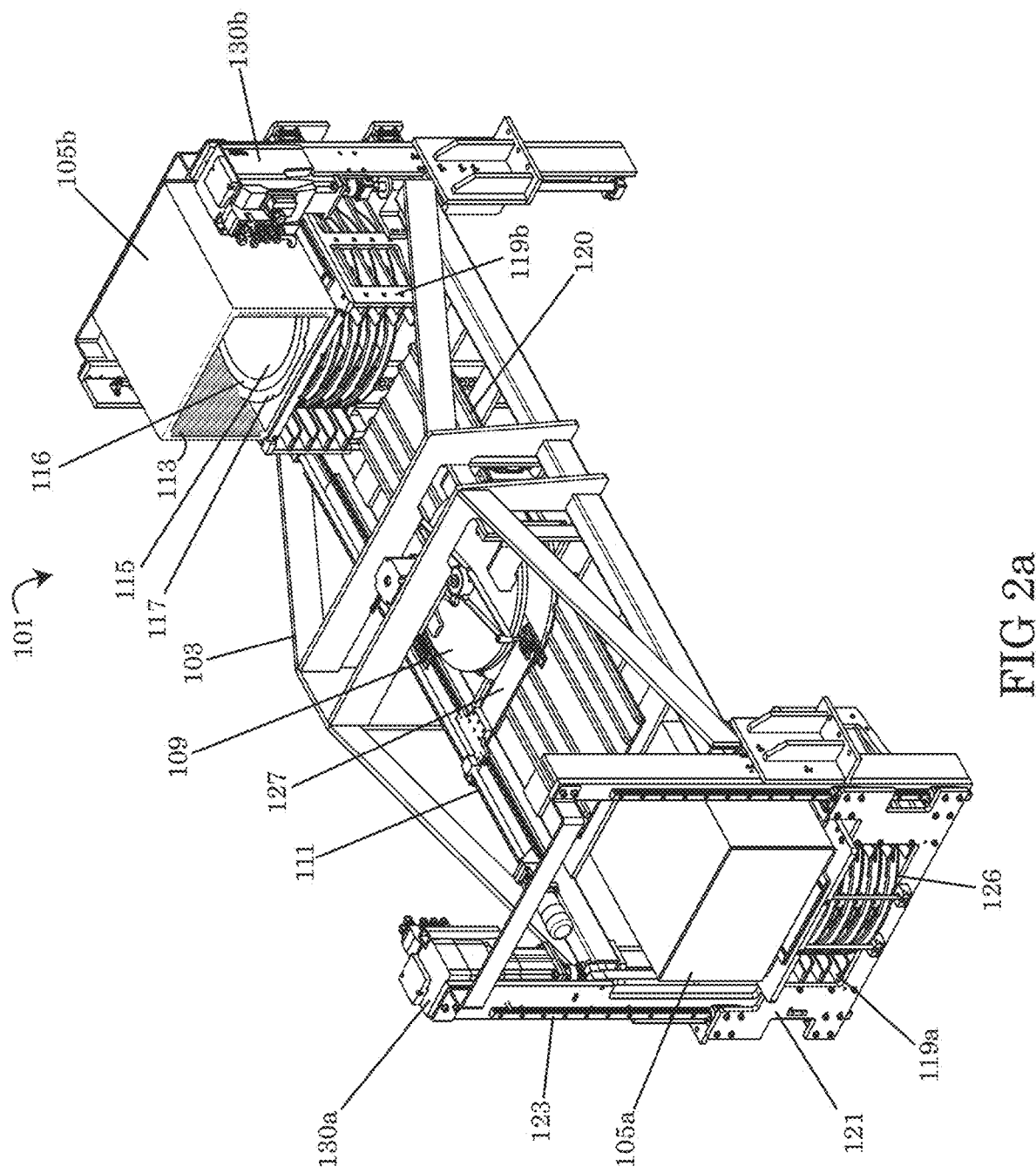
FIG. 2a depicts an isometric view of an embodiment of a wafer handling subsystem.
Figure 2B:
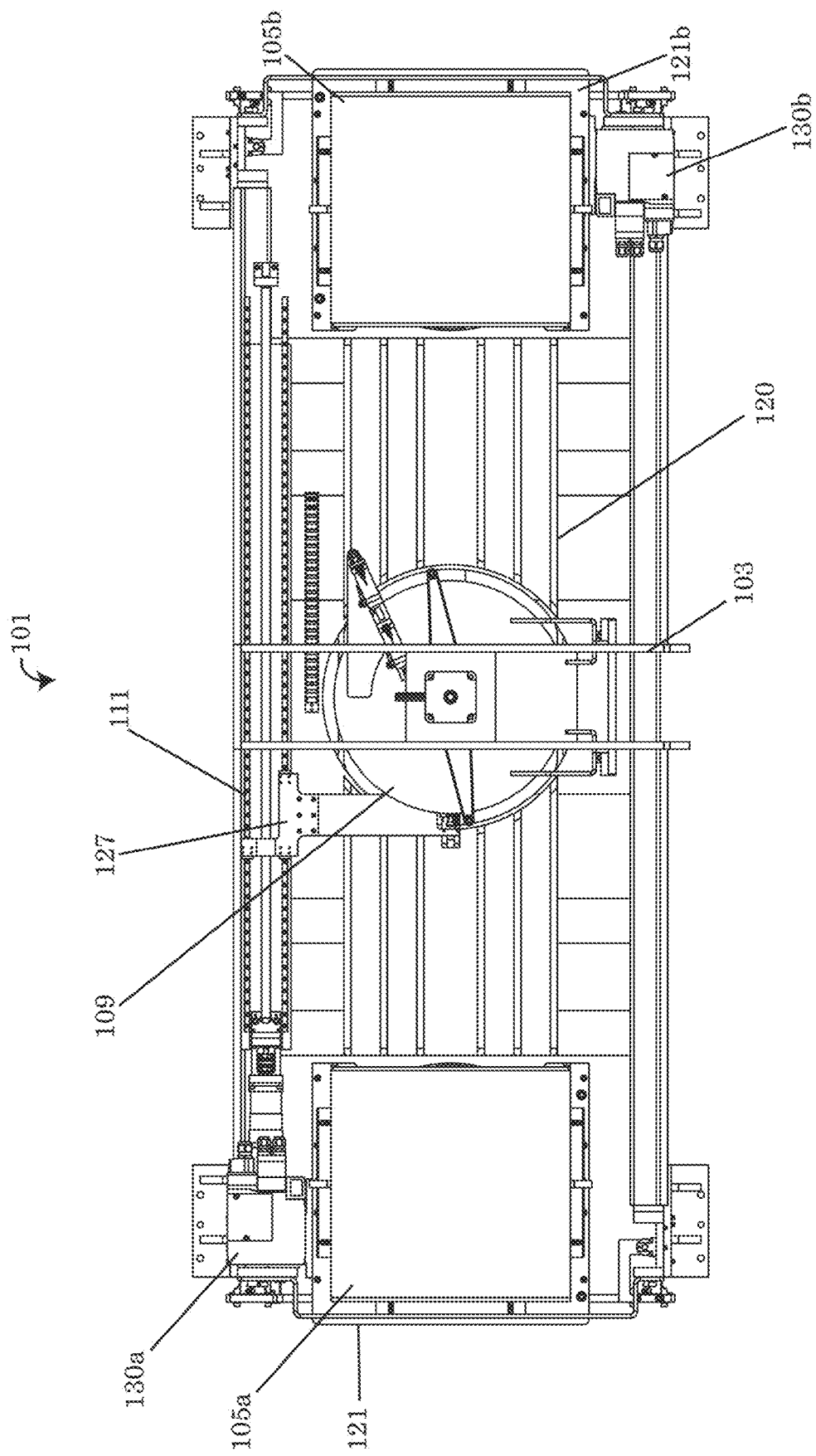
Figure 2C:
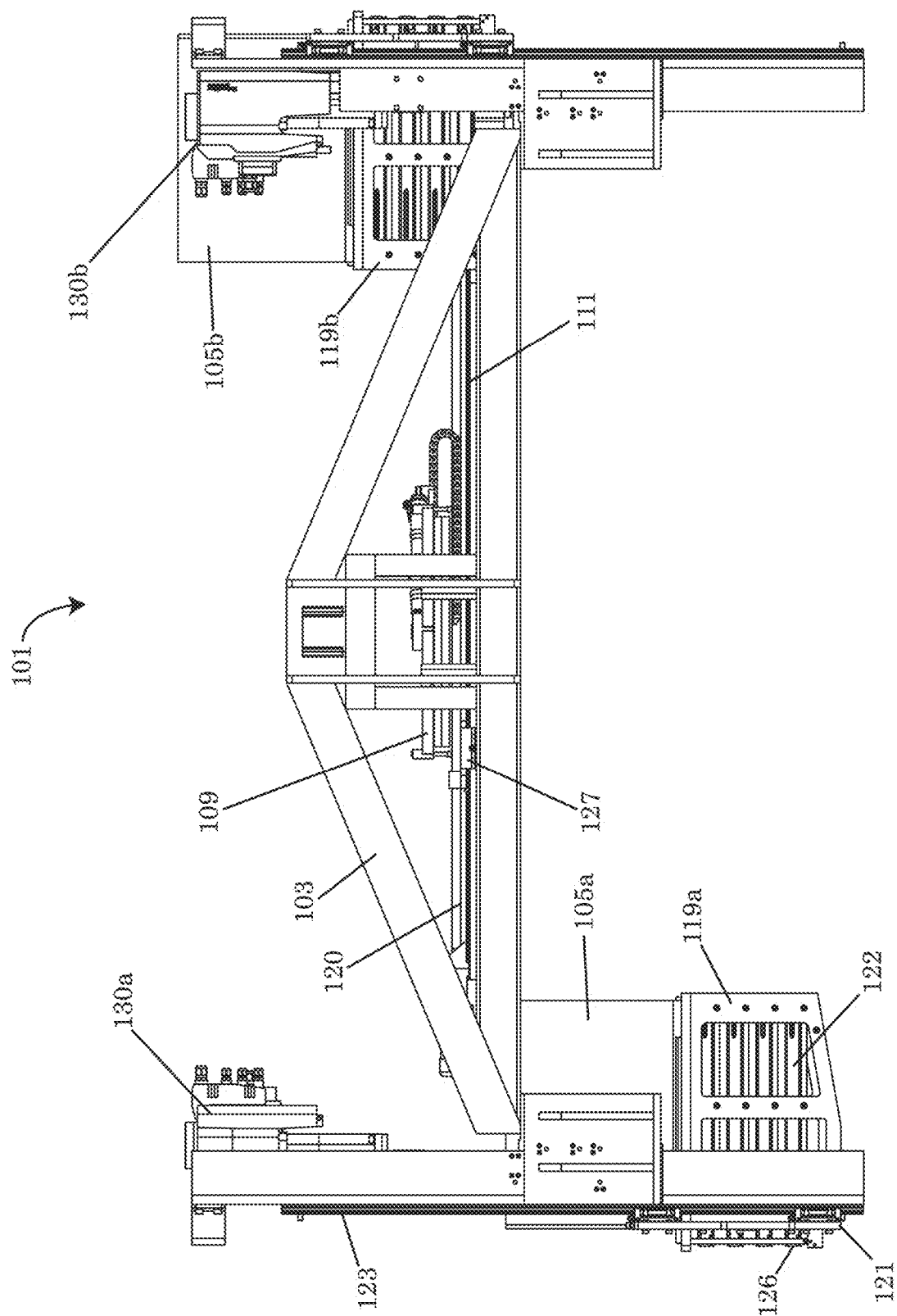

Referring to the drawings, FIG. 1 illustrates an embodiment of a die handling system 100. The die handling system 100 may, in some embodiments, be constructed as a plurality of subsystems and/or modules connected together. By building the system 100 as a group of subsystems or modules, the one or more subsystems or modules may be added or removed from the system 100 as desired by a user. As shown in FIG. 1, the die handling system 100 may include a die handler 150 and a wafer handling system 101. The wafer handling system 101 may be divided into additional subsystems and modules, for example a wafer storage module 300, an expansion module 400 and an elevator module 130.

Embodiments of the wafer handling system 101 may perform the function of receiving, storing, pre-expanding and delivering prepared wafer materials to a die handler 150. Prepared wafers 500 may be loaded into the wafer handling system 101 by attaching one or more pre-loaded cassettes filled with prepared wafers 500 of one or more different configurations. Attachment of the one or more cassettes 105a, 105b (referred to as "cassettes 105") may be performed manually by a user or automatically using a robotic system. The term "wafer" 115 may refer to a slice or substrate of semiconductor material. The semiconductor material may be a material having a crystalline structure. The most popular semiconductor material currently used in wafers is crystalline silicon. However, other semi-conductor materials known by a person skilled in the art may be substituted for silicon materials in some configurations of the prepared wafers 500. For example, in addition to silicon, the wafers 115 may be made of germanium, gallium arsenide, silicon carbide, gallium nitride, gallium phosphide, cadmium sulfide or lead sulfide.

Embodiments of wafers 115 loaded into the cassettes 105 of the wafer handling system 101 may be constructed into various dimensions, including different diameters and thicknesses. In some embodiments, wafers 115 may have a diameter of less than 25 mm up to 450 mm (1 inch to 17.7 inches). For example, the diameters of the wafer may be 25 mm (1 in.), 51 mm (2 in.), 76 mm (3 in.), 100 mm (4 in.), 125 mm (4.9 in.), 130 mm (5 in.), 150 mm (5.9 in.), 200 mm (7.9 in.), 300 mm (11.8 in.) or 450 mm (17.7 in.). The size of the wafers 115 loaded into cassettes 105 of the die handling system 100 may have various thicknesses as well. The thickness of the wafers 115 may vary between 25 μm to 3000 μm. For example, the thickness of the wafers 115 may be 25 μm, 50 μm, 100 μm, 200 μm, 275 μm, 375 μm, 525 μm, 625 μm, 675 μm, 725 μm, 775 μm, 925, 1000 μm, 1500 μm, 2000 μm, 3000 μm or thicker.

Figure 5:
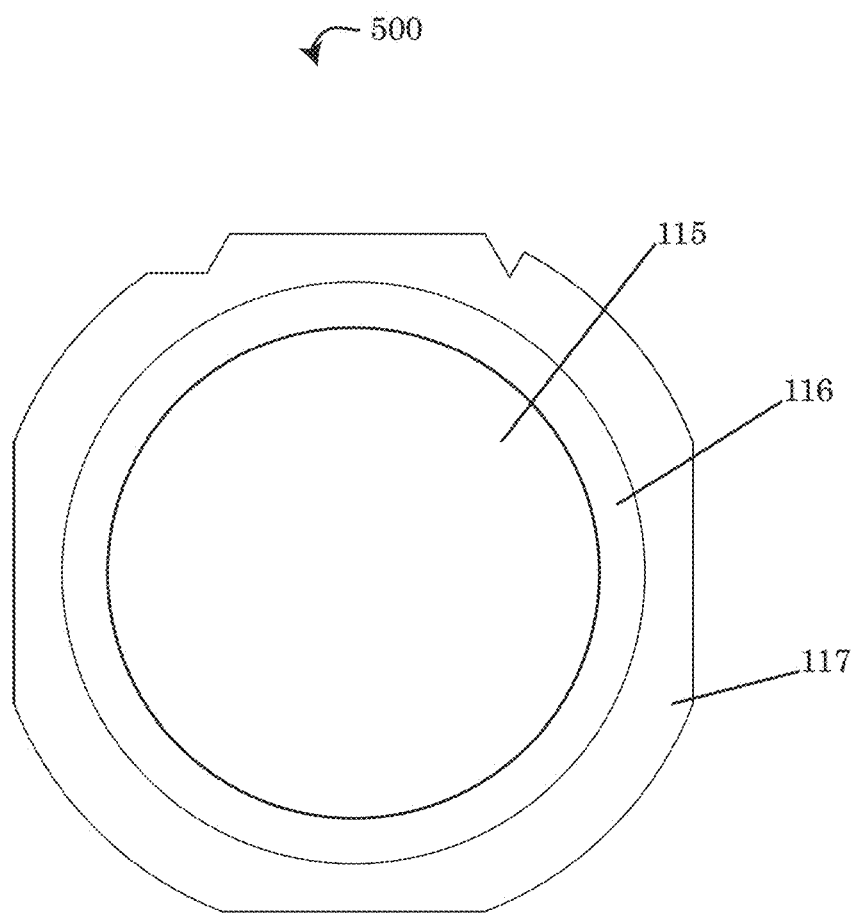
FIG. 5 depicts an embodiment of a wafer prepared for pre-expansion.

The cassettes 105 may each store a plurality of prepared wafers 500 as shown in FIG. 5, wherein each prepared wafer 500 may include a wafer of a particular configuration. The term "configuration" may refer to the differences in wafer 115 properties, including the dimensions, materials, thickness, circuitry, die size, etc. Each of the prepared wafers 500 provided to or received by the die handling system 100 may be indexed to one of the slots 113 of the one or more of the cassettes 105. In the exemplary embodiment of the cassettes 105 of the wafer handling system 101, each cassette 105a, and 105b may store up to twenty-five prepared wafers 500. For each prepared wafer 500, a wafer 115 may be mounted to a frame 117 containing a film 116, such as a Mylar film. In some embodiments, the prepared wafers 500 may be further prepped for expansion prior to being loaded in the cassettes 105. The prepared wafers 500 may undergo backgrinding, UV curing and dicing steps prior to being loaded into the cassettes 105 in some embodiments.

Indexing each prepared wafer 500 to a particular cassette 105 may depend on the wafer 115 material and dimensions of the wafer 115. As shown in the figures, a plurality of cassettes 105 may be integrated into the wafer handling system 101. Each cassette 105 may index and store wafers comprising a different dimension or material. For example, a first cassette 105a may index and store prepared wafers 500 comprising a 150 mm silicon wafers having a thickness of 275 μm, whereas the second cassette 105b may index and store prepared wafers 500 having a 30 mm wafer 115 with a thickness of 575 μm. Thus, allowing the die handling system 100 to expand and process multiple different types of wafers 115 without having to change over the wafer materials, retool each of the devices within the system 100 or replace the cassettes 105. In some embodiments, cassette 105 changeovers may be performed during operation of the die handling system 100. Each cassette 105 may be detached from the wafer handling system 101 and replaced with either a fresh cassette 105 loaded with the same prepared wafers 500 or the cassette 105 may be replaced with a cassette 105 loaded with prepared wafers 500 having a different wafer material. The cassettes 105 may be detached and replaced manually by human users or in some embodiments by robotic devices.

In some embodiments of the system 100, the wafer handling system 101 may attach each of the cassettes 105 to an elevator module 130 (each separate elevator 130 may be referred to as specific elevators, for example elevator 130a, connected to cassette 105a and elevator 130b which is connected to cassette 105b in the drawings). The elevators 130 may be configured to raise and lower the cassettes 105 and pre-expanded wafer holding devices 119 attached to the cassettes 105, between the wafer table 120 of the wafer handling system 101 and the platform 161 of the die handler 150. Embodiments of the elevator 130 may align the appropriate slot 113 of the cassette 105 with the wafer table 120 in order to allow for the wafer table arm 127 to pull a prepared wafer 500 from the slot 113 to the expander 109. Once the prepared wafer 500 has been expanded, the elevator 130 may adjust the height of the storage module 300 in order to align the pre-expanded wafer holding device 119 with the wafer table 120. By adjusting the height of the storage module 300 containing the pre-expanded wafer holding device, the wafer table arm 127 may remove the pre-expanded wafer 126, 726 from expander 109 and load the pre-expanded wafer 126, 726 into a slot of the pre-expanded wafer holding device 119 aligned with the wafer table 120. In some embodiments, the wafer table arm 127 may turn or rotate the pre-expanded wafer 126, 726 in order to pre-orientate the position of the pre-expanded wafer 126, 726 while the pre-expanded wafer 126, 726 is being stored in the pre-expanded wafer holding device 119. For example, the wafer table are 127 may rotate the pre-expanded wafer 126, 726 in 90 degree increments prior to depositing the pre-expanded wafer 126, 726.

Figure 3A:
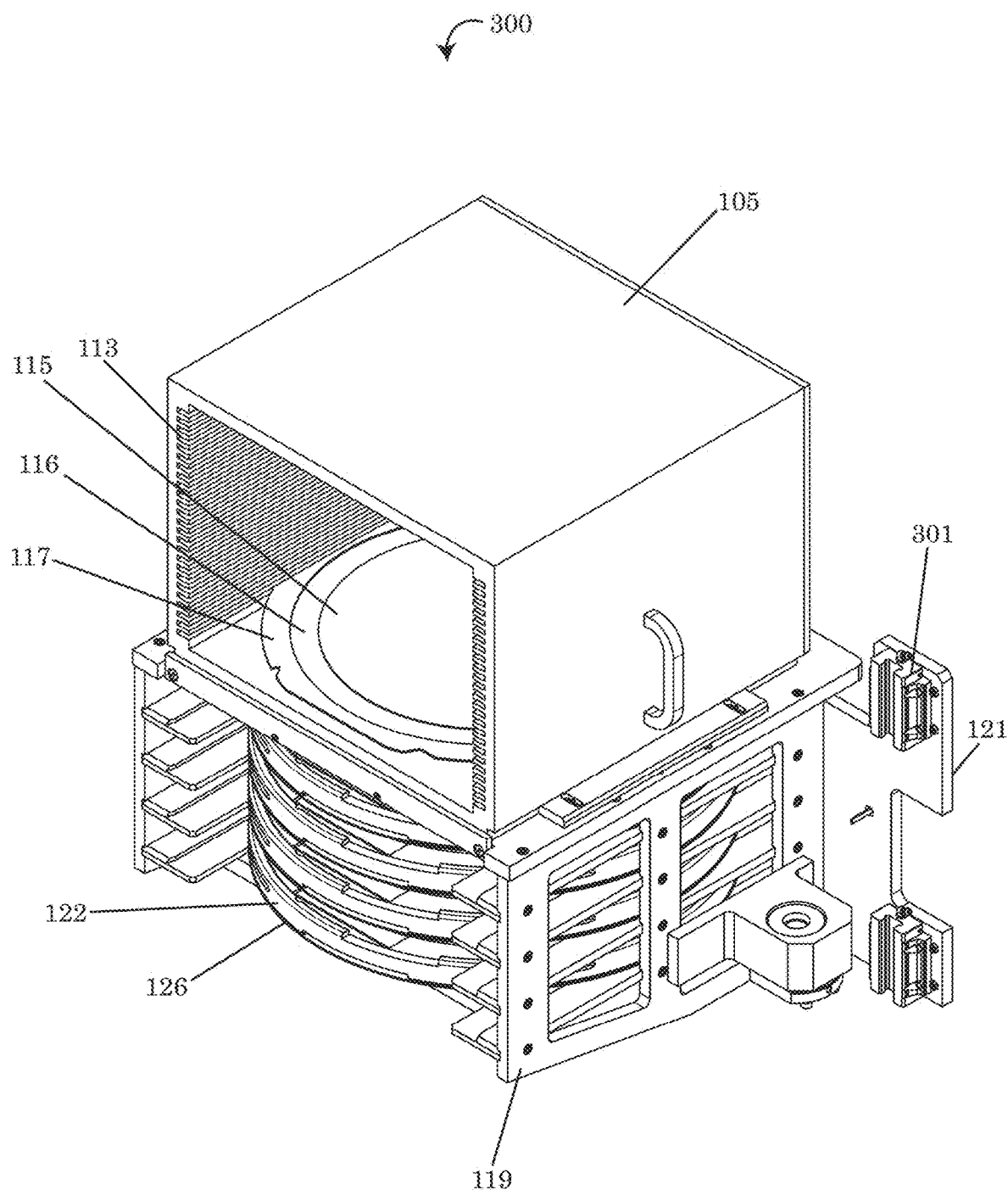
FIG. 3a depicts a isometric view of an embodiment of a wafer storage module of a wafer handling subsystem.
Figure 3B:
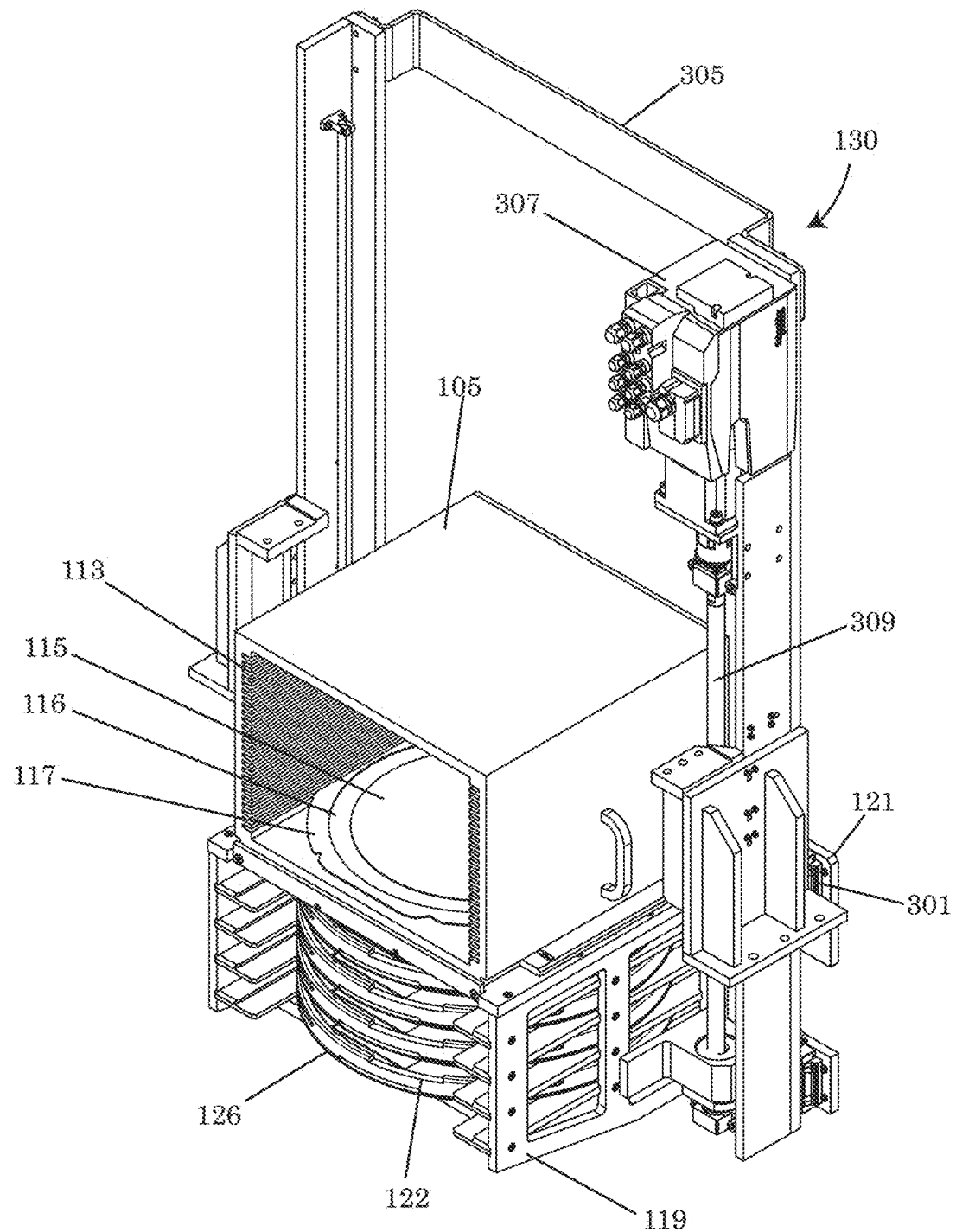
FIG. 3b depicts an isometric view of an embodiment of a wafer storage module connected to an elevator system of a wafer handling subsystem.
Figure 3D:
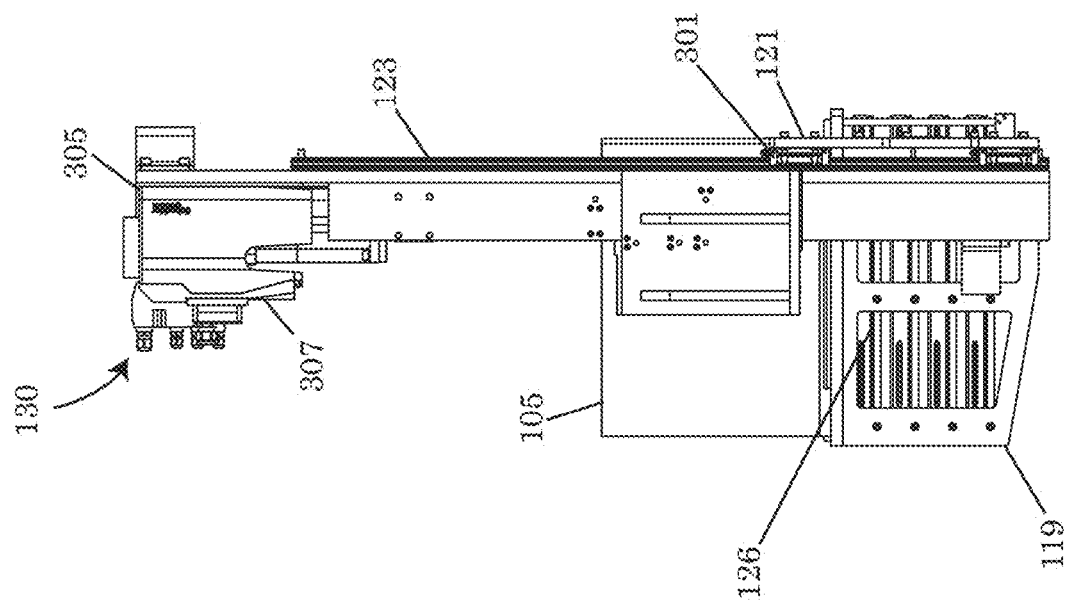
FIG. 3d depicts a side view of the wafer storage module connected to the elevator system of FIG. 3b.
Figure 3C:
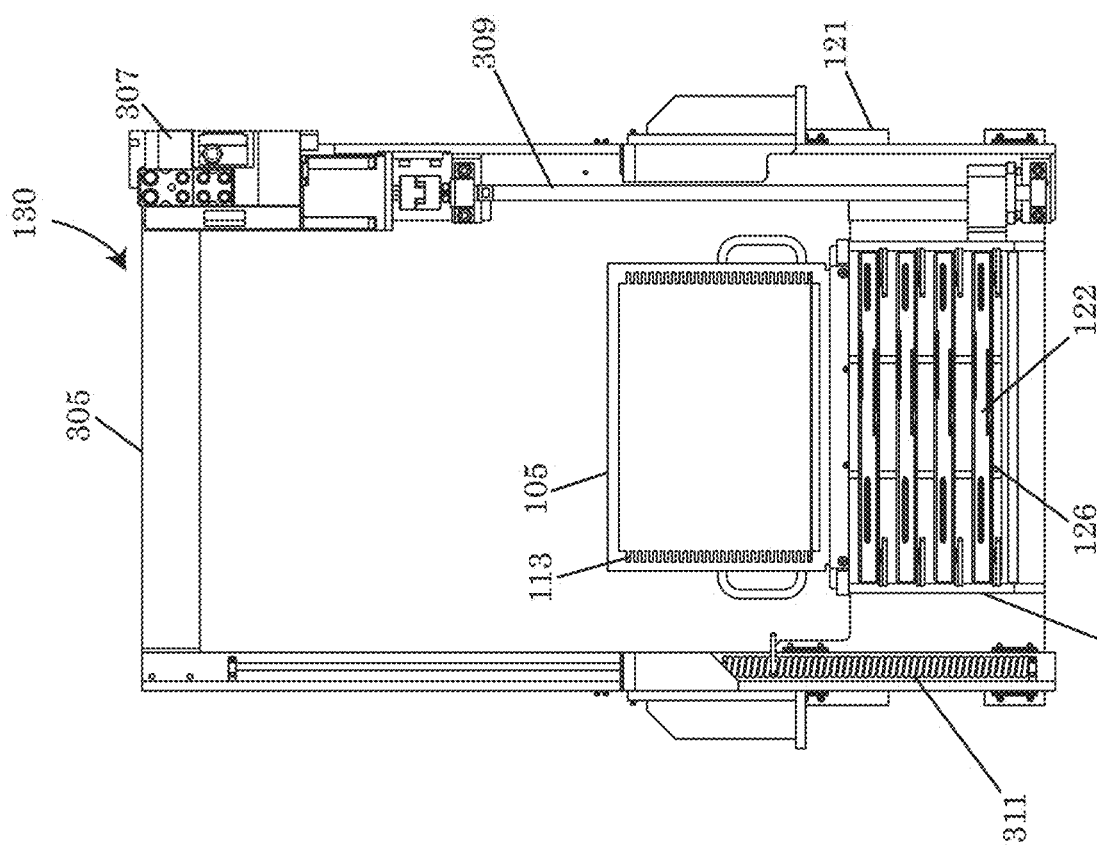
FIG. 3c depicts a front view of the wafer storage module connected to the elevator system of FIG. 3b.
Figure 4A:
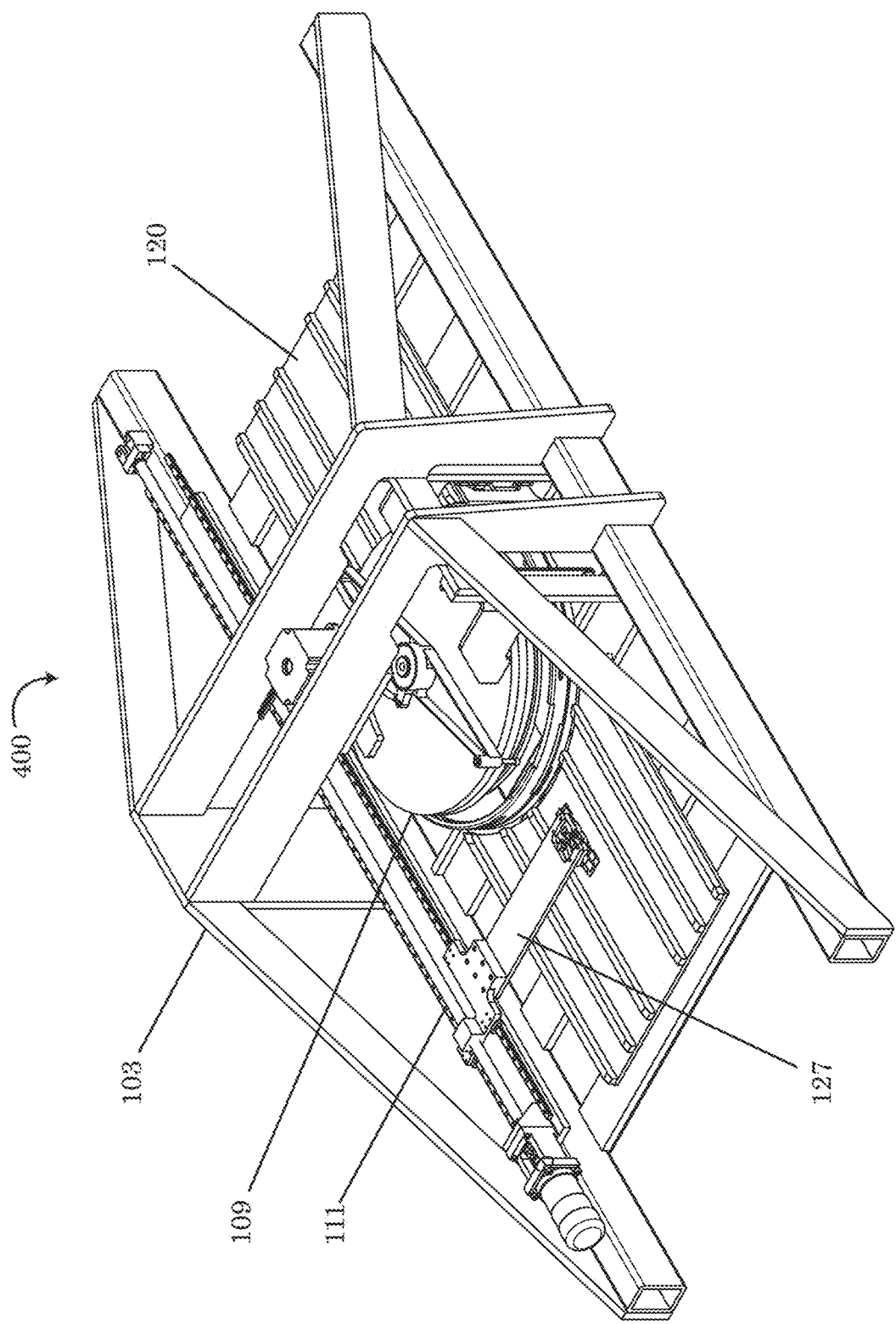
FIG. 4a depicts an isometric view of an embodiment of an expansion module of a wafer handling subsystem.
Figure 4B:
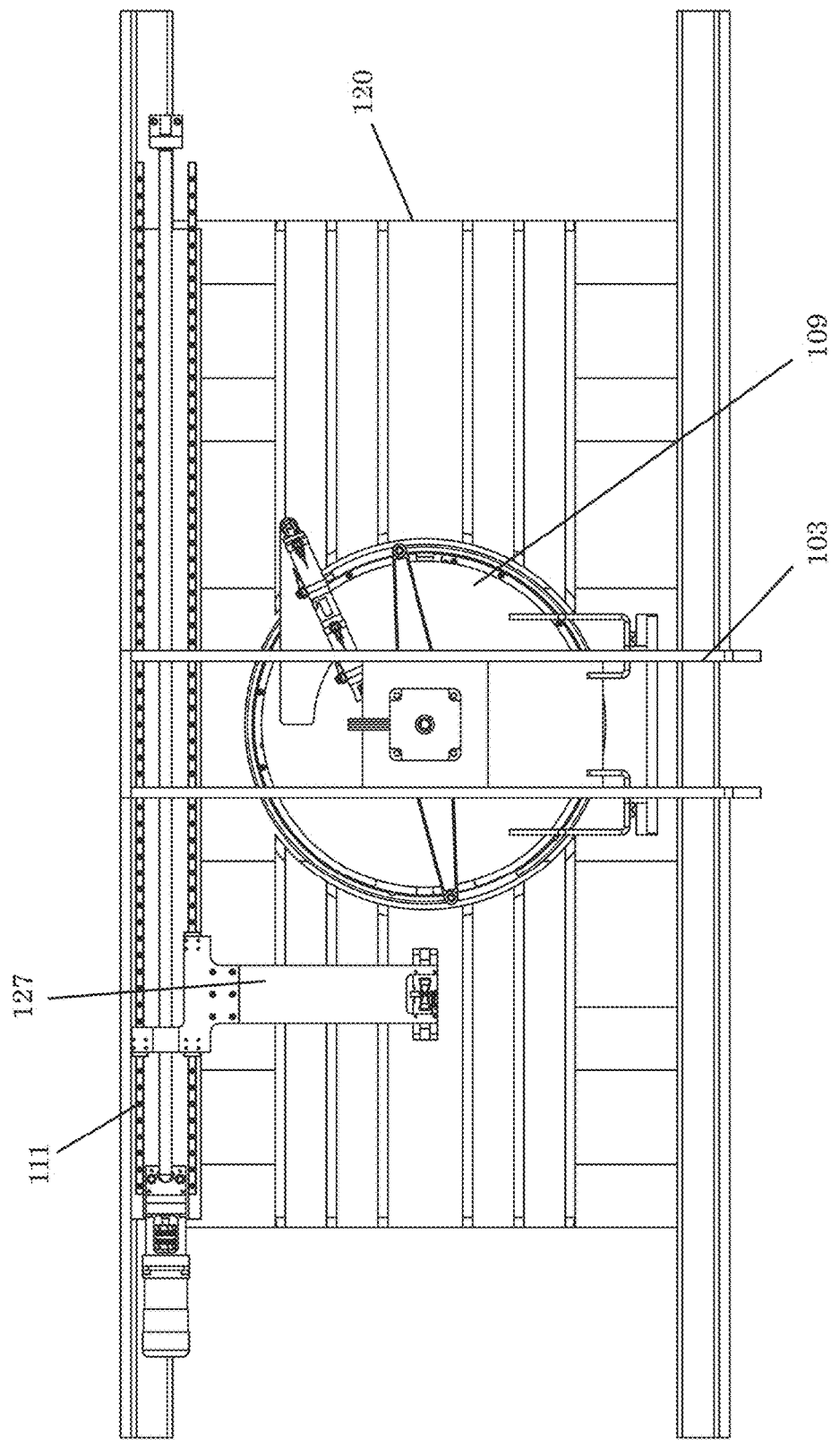
Figure 4C:
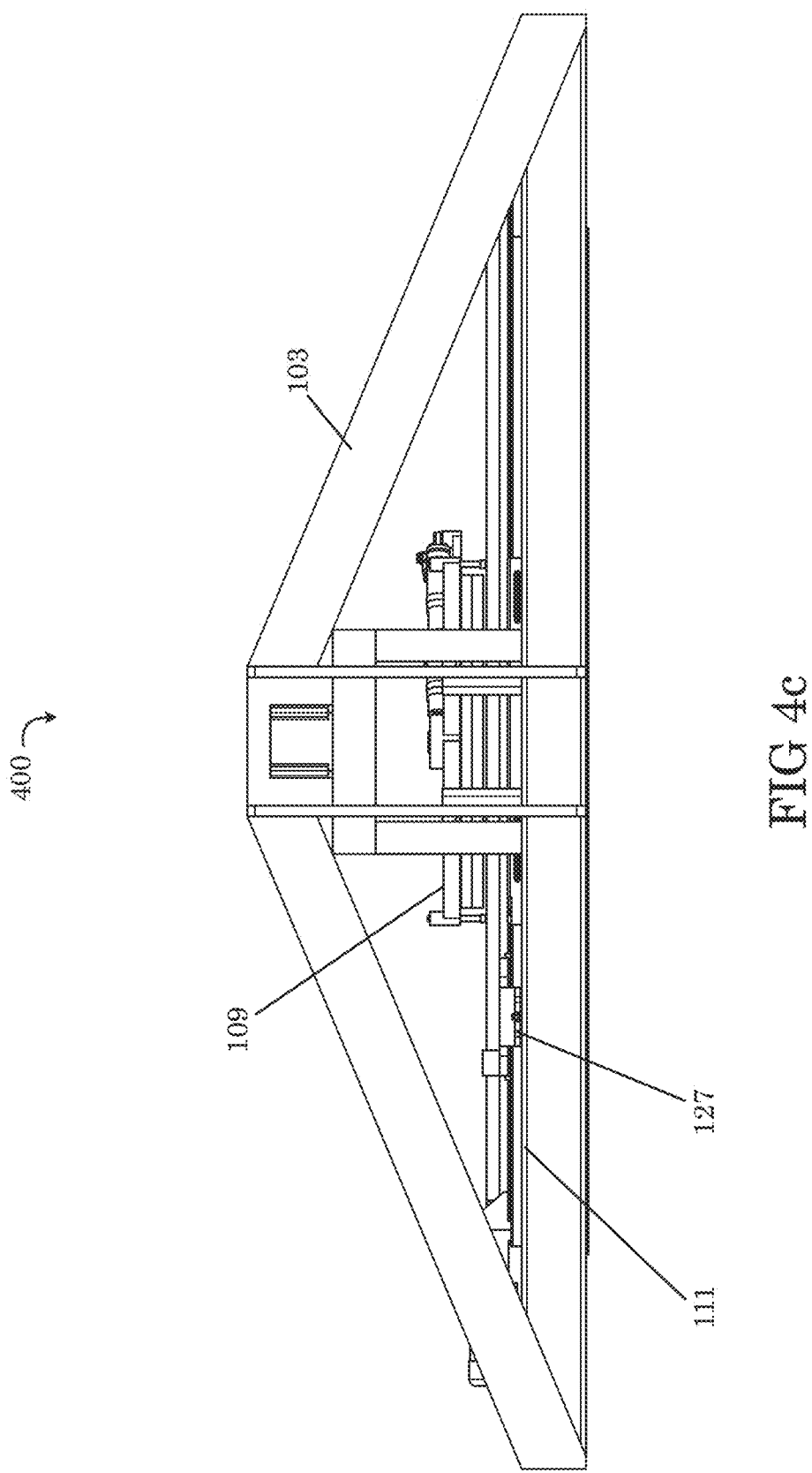
Figure 4D:
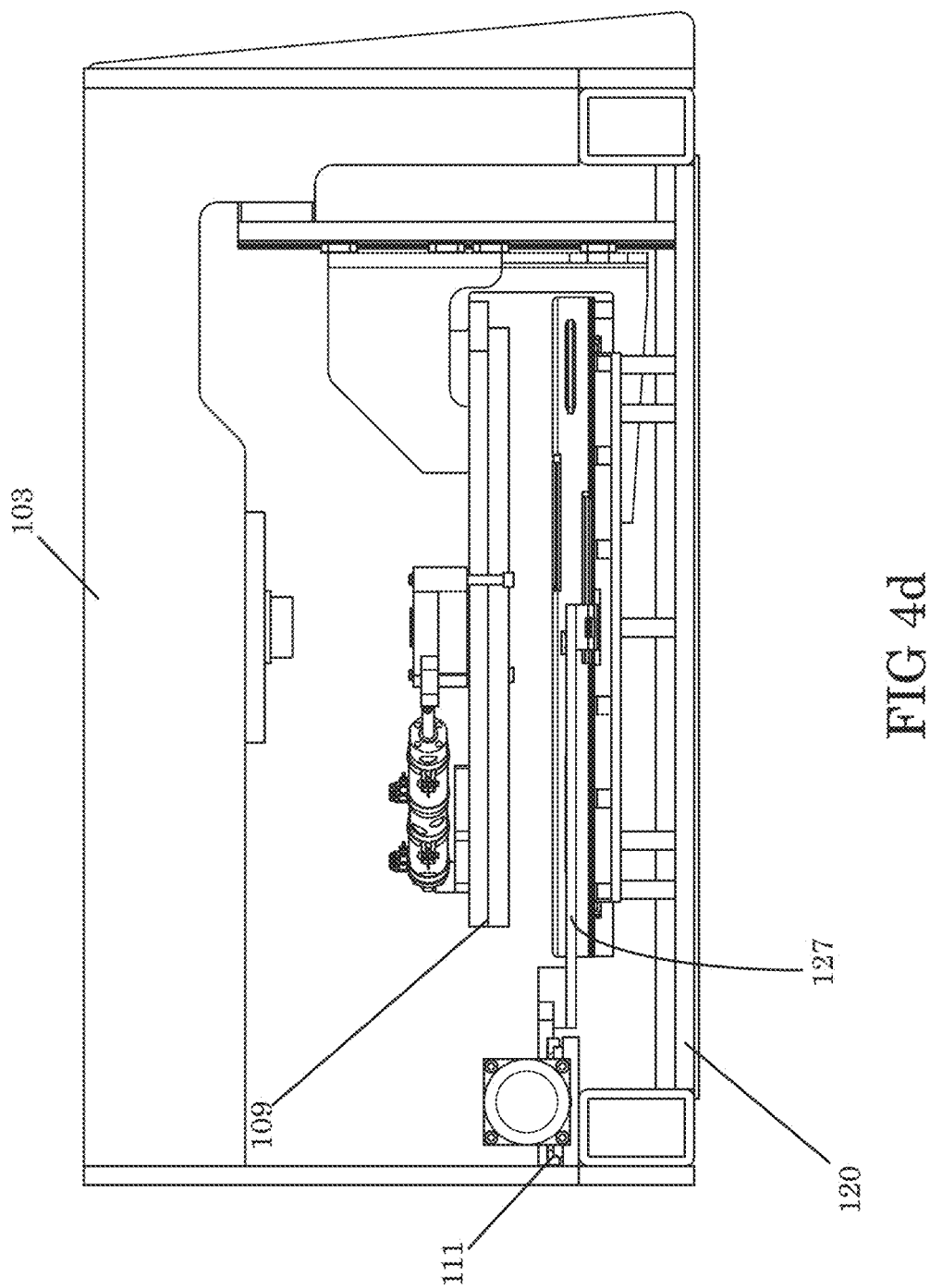

Embodiments of the elevator module 130 may comprise an elevator frame 305 supporting the components of the elevator system 130 described below. A servo motor 307 may manage the initiation of a drive mechanism controlling the activity of the elevator 130, lead screw 309, and a rear plate 121 connected to the wafer storage module 300 comprising the cassette 105 and the pre-expanded wafer holding device 119. The rear plate 121 may attach to the rear of the pre-expanded wafer holding device 119 as shown in FIG. 3a. However, in some alternative embodiments, the rear plate 121 may be attached to the rear of the cassette 105 or other portions of the wafer storage module. In some embodiments of the elevator system 130, guide rail brackets 301 may be attached to the rear plate 121. The guide rail brackets may be sized and shaped to form a channel that may interconnect with the guide rail 123 positioned on the rear of frame 305 as shown in the drawings.

As the servo motor 307 initiates the drive mechanism, the elevator may raise or lower via the lead screw 309. The rear plate 121 attached to the guide rail 123 via the guide rail brackets 301 may raise and lower along the guide rails 123 as the lead screw raises and lowers the rear plate 121, changing the overall position of the storage module 300 and the alignment of the wafer slots 113 or the slots of the pre-expanded wafer holding device 119 in relation to both the wafer table 120 and the die handler 150's platform 161.

In some embodiments of the wafer handling system 101, the wafer handling system 101 may include an expansion module 400. Embodiments of the expansion module 400 may comprise a frame 103 supporting the wafer table 120 having an expander 109 positioned thereon. In some embodiments a vision system comprising a camera capable of inspecting the retrieval of prepared wafers 500, the expansion of prepared wafers 500 into pre-expanded wafers 126, 726 and the storage of pre-expanded wafers 126, 726 in a slot of the pre-expanded wafer holding device 119 may be installed into the expansion module 400. Embodiments of the frame 103 may also include a positioning and retrieval system comprising a track 111, which may extend the length of the wafer table 120 and a moveable wafer table arm 127. Embodiments of the moveable wafer table arm 127 may be connected with the track 111, allowing for the wafer table arm 127 to move along the track 111 during operations of the wafer table 120 and expander 109.

Using the track 111 as a guide, the wafer table arm 127 may move along the axis created by the track 111. The track 111 enables the arm 127 to move from one side of the wafer table 120 to the other side. As shown in the embodiments of FIG. 1a-2c, each of the cassettes 105 may be aligned with the edges of the wafer table 120, allowing for the wafer table arm 127 to position next to each of the cassettes 105, retrieve a prepared wafer 500 indexed to a cassette 105 slot 113, pull the prepared wafer 500 from the slot 113. Once the prepared wafer has been pulled from the cassette 105 slot 113, the wafer table arm 127 may ride along the track 111, with the pulled wafer 500 in tow, to the expander 109. The wafer table arm 127 may position the prepared wafer 500 onto the expander 109 for expansion into a pre-expanded wafer 126, 726.

Embodiments of the expander 109 may perform the function of expanding the prepared wafers 500 into pre-expanded wafers 126, 726. The expander 109 may increase the amount of surface area of the wafer 115 by extending the wafer 115 in the X and Y directions to an expanded size. The expander 109 may press the wafer 115, and may be assisted by heat exerted by the expander 109 to increase the expansion depth of the wafer 115 resulting in an expanded wafer 124, 724.

Figure 6A:
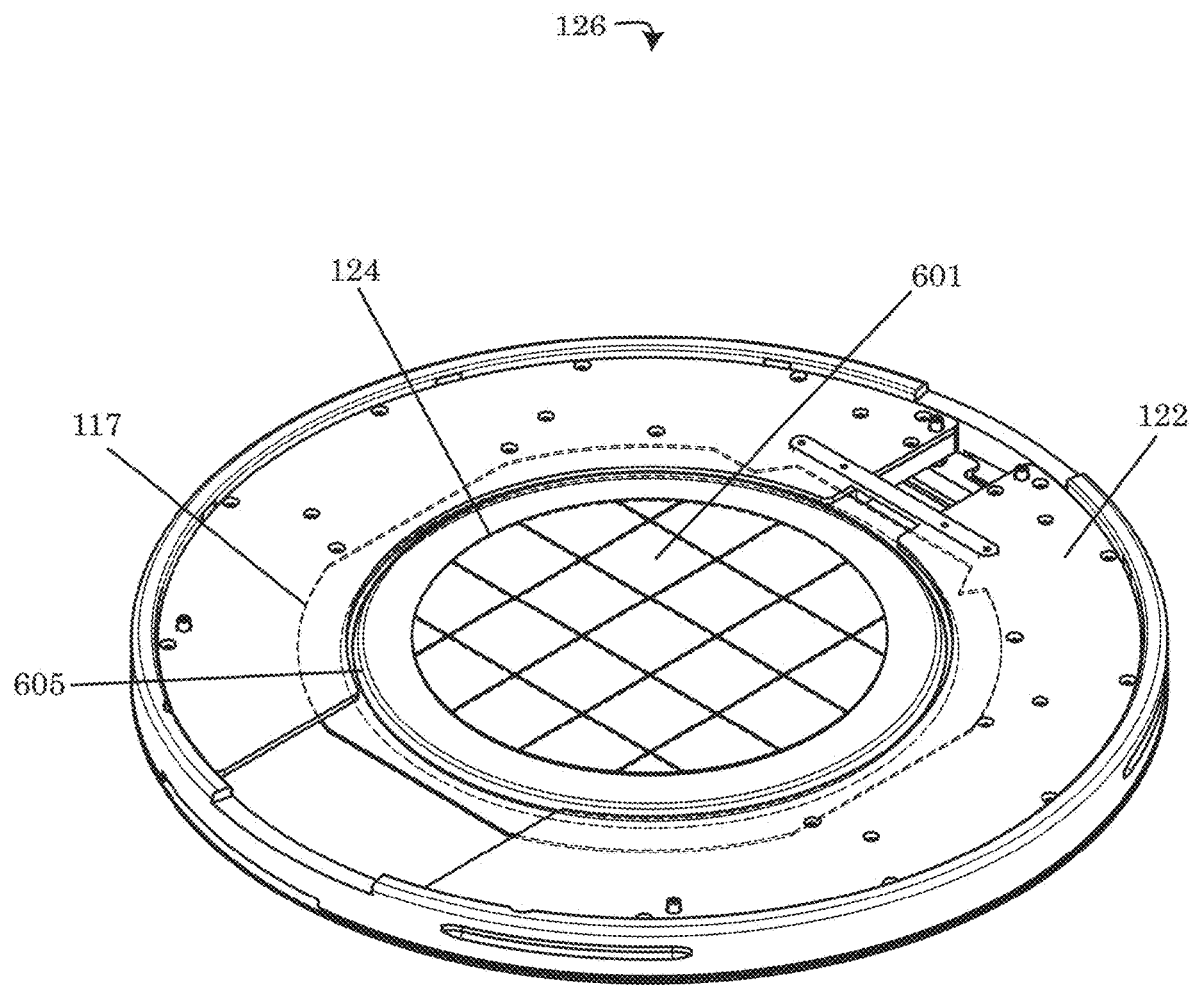
FIG. 6a depicts an isometric view of an embodiment of a pre-expanded wafer of a first size loaded into a cartridge.
Figure 6B:
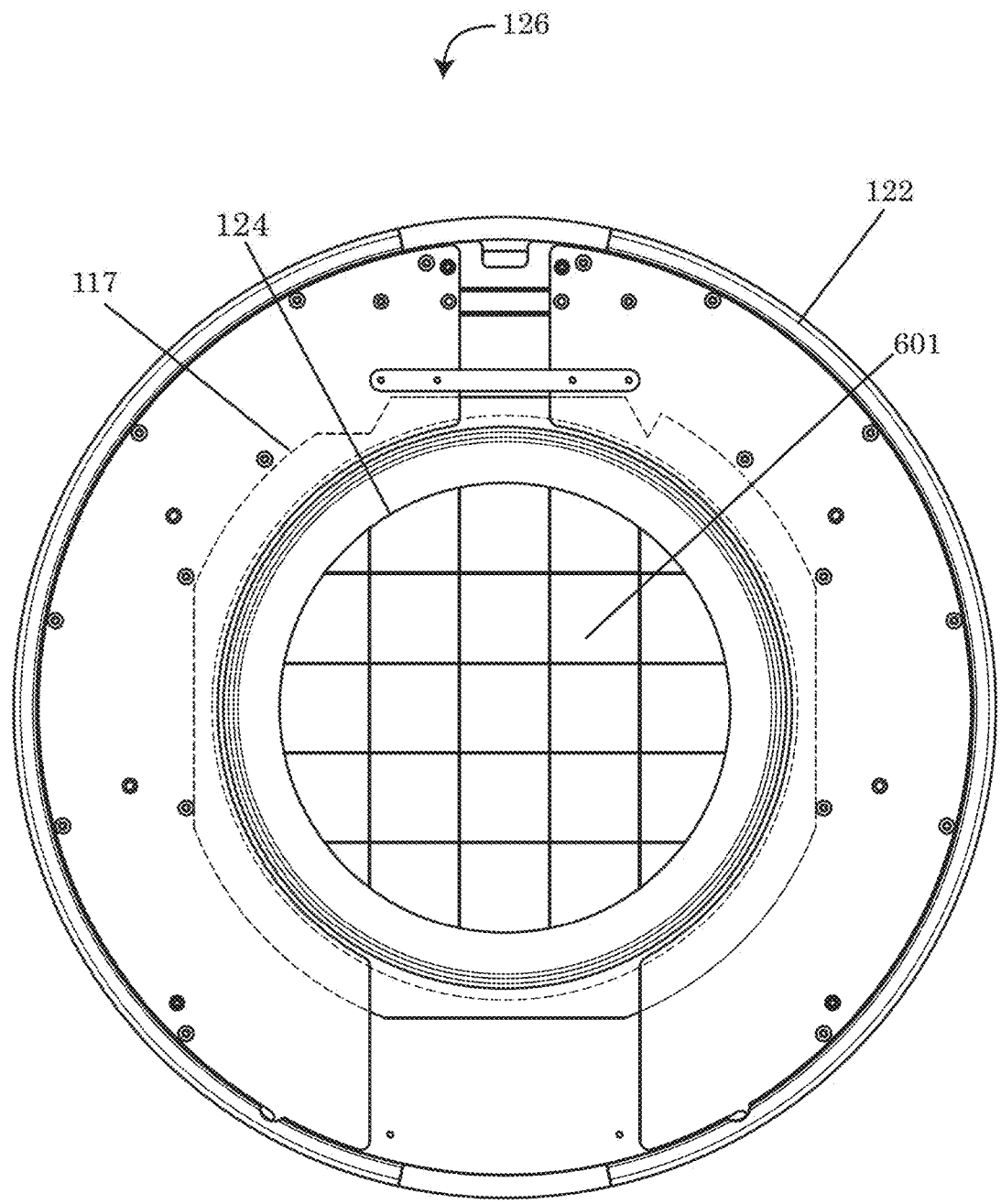
FIG. 6b depicts a top view of the pre-expanded wafer of a first size of FIG. 6a, loaded into a cartridge.
Figure 7A:
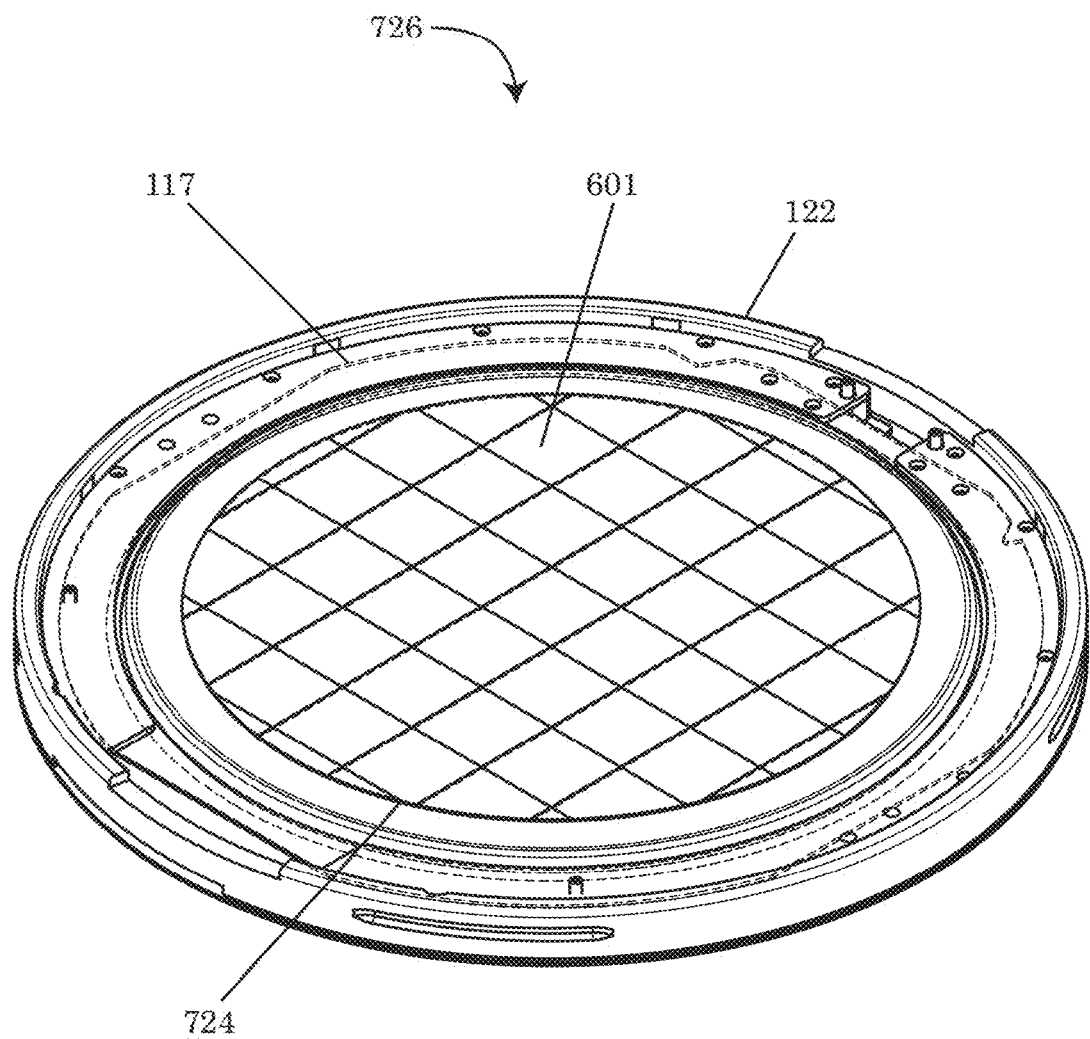
FIG. 7a depicts an isometric view of an embodiment of a pre-expanded wafer of a second size loaded into a cartridge.
Figure 7B:
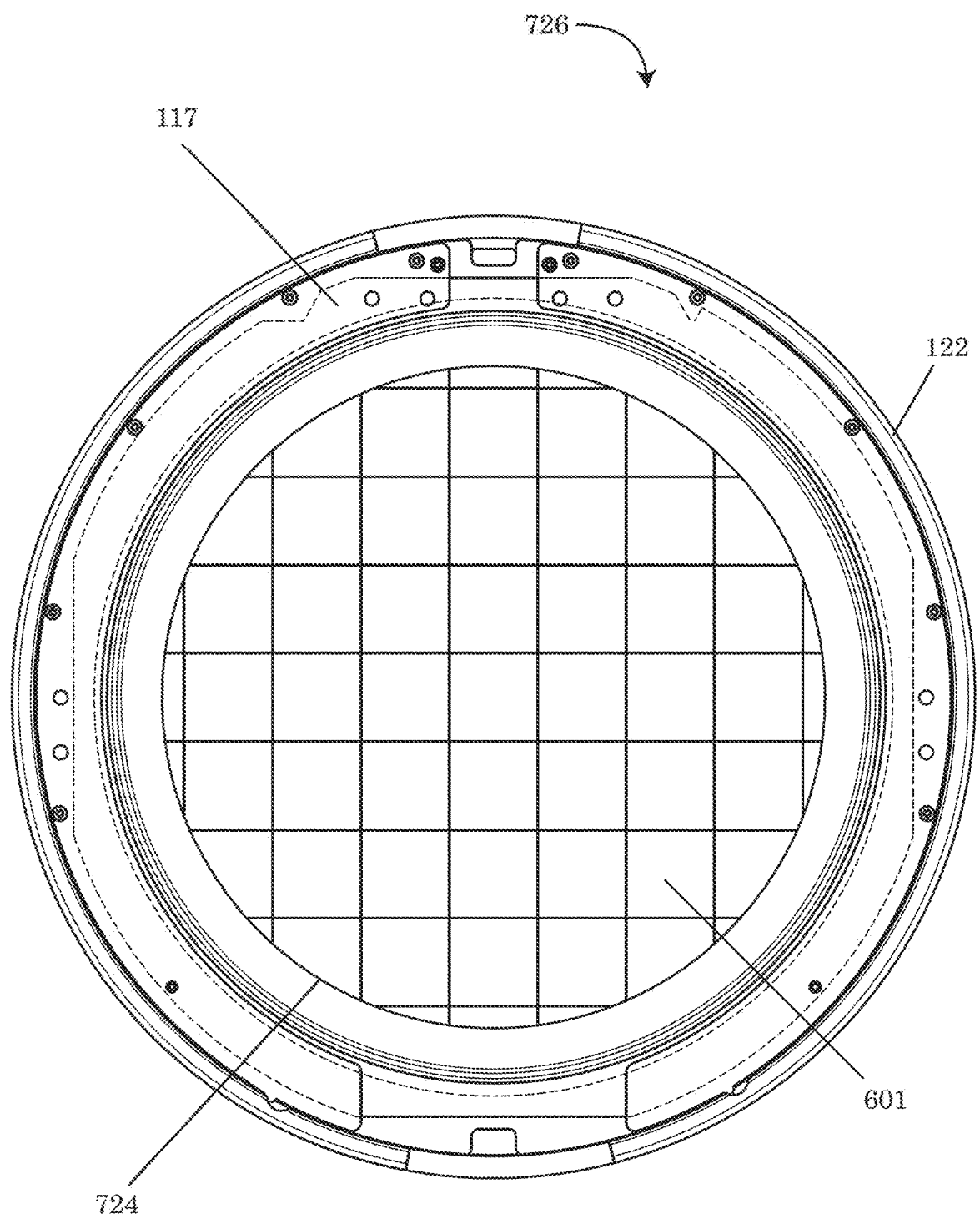
FIG. 7b depicts a top view of the pre-expanded wafer of a second size of FIG. 7a, loaded into a cartridge.

Embodiments of expander 109 may encapsulate the expanded wafers 124, 724 in a cartridge 122, which may maintain the expanded wafer 124, 724 as a pre-expanded wafer 126, 726 until either the die handler 150 has extracted the dies from the pre-expanded wafer 126, 726 or the pre-expanded wafer 126, 726 has been de-expanded by expander 109 back into a prepared wafer 500. FIGS. 6a-6b depict an embodiment of a pre-expanded wafer 126 having an expanded wafer 124 of a first size encapsulated by a cartridge 122, while FIGS. 7a-7b depict a pre-expanded wafer 726 having an expanded wafer 724 of a second size encapsulated by the cartridge 122. Each of the cartridges 122 may be capable of encapsulating wafers 115 of various dimensions and thicknesses. In some embodiments, the opening of the cartridges 122 exposing the expanded wafers 124, 724 may be adjustable to accommodate the sizes of wafers 115 used during the expansion process. In alternative embodiments, the plates forming the cartridge 122 may be specifically designated for specific expanded wafer sizes.

Embodiments of the cartridge 122 may comprise two interlocking plates that may interconnect, snap fit or be attached together in order to hold the wafer 115 positioned onto the film 116 and frame 117 to be held within the cartridge 122. Between the top and bottom plates of the cartridge 122, the expanded wafer 124, 724, film 116 and frame 117 may be positioned therein. The frame 117, of the prepared wafer 500 may be positioned between the top plate and the bottom plate of the cartridge 122. When the plates of the cartridge 122 are fitted or attached together, the cartridge 122 may hold the frame 117 in place between the plates of the cartridge 122, and thus hold the wafer 115 in place while the wafer 115 is exposed to the expander during the expansion process into an expanded wafer 124, 724. During the expansion process, the wafer 115 may be stretched to varying depths, as desired, to create the expanded wafer 124, 724.

Upon completion of the expansion process, the cartridge 122 encapsulated, pre-expanded wafers 126, 726 may be removed from the expander 109 by the wafer table arm 127. The wafer table arm 127 may pull the pre-expanded wafer 126, 726 from the expander 109, move the pre-expanded wafer 126, 726 across the wafer table 120 via the track 111 and deposit the pre-expanded wafer into a pre-expanded wafer holding device 119a, 119b (referred to generically or collectively as "pre-expanded wafer holding device 119"). Embodiments of the pre-expanded wafer holding device 119 may each be attached to a cassette 105 and an elevator 130. Each pre-expanded wafer holding device 119 may include a plurality of slots, wherein each slot of the pre-expanded wafer holding device 119 may house pre-expanded wafers 126, 726 prior to die extraction by the die handler 150. In some embodiments of the system 100, the system 100 may index each slot of the pre-expanded wafer holding device 119 in order to ensure that the system 100 may know which slots of the pre-expanded wafer holding device are currently occupied by pre-expanded wafers 126, 726, which pre-expanded wafers 126, 726 have been removed from the slots because the pre-expanded wafers 126, 726 are currently being processed by the die handler 150 and which slots of the pre-expanded wafer holding device 119 may be still empty or ready to receive an additional pre-expanded wafer 126, 726.

In the exemplary embodiments depicted in the drawings, each pre-expanded wafer holding device 119 may comprise four slots. However, the number of available slots for housing pre-expanded wafers 126, 726 may vary. The system 100 may include additional slots in the pre-expanded wafer holding devices 119 or fewer slots depending on the throughput and size of the system 100. To load a particular slot of the pre-expanded wafer holding device 119, the elevator 130 may raise or lower a desired slot of the pre-expanded wafer holding device 119 to align with the height of the wafer table 120. The wafer table arm 127, shuttling the pre-expanded wafer 126, 726 across the wafer table 120 from the expander 109, may deposit the pre-expanded wafer 126, 726 into the slot of the pre-expanded wafer holding device 119.

Embodiments of the die handler 150 may perform the function of extracting one or more dies 601 from each of the pre-expanded wafers 126, 726, visually inspect the extracted dies 161 of the pre-expanded wafers 126, 726 via the in-line vision system 157a, 157b (referred herein either collectively or generically as "vision system 157"), as shown in FIGS. 9a-9e and deliver the extracted dies 180 to downstream processing equipment, such as a pick and place machine. Embodiments of the die handler 150 may include an XY table capable of moving and positioning the pre-expanded wafers 126, 726 in the proper position and orientation, allowing for the pick head 170 of the die handler to properly position itself over each die 601 and commence extraction of the die. Embodiments of the XY table of the die handler 150 may include a track system 155 and puller 163 similar to the track 111 and wafer table arm 127 of the expansion system 400 described above.

The track system 155 of the XY table may allow for movement along an X axis across the XY table, from one end of the XY table to the other. For example, puller 163 may traverse the length of the XY table in order to access the pre-expanded wafers 126, 726 housed within the slots of the pre-expanded wafer holding device 119. The puller 163 may remove the pre-expanded wafer 126, 726 from the pre-expanded wafer holding device 119, and traverse along the track 155 until the puller affixes the pre-expanded wafer 126, 726 onto one of the platforms 161a, 161b (referred to collectively or generically as platform 161) of the XY table. The track 155 may also include a separate interior track, on which the platforms 161 may interface with. The interior track of the XY table, may allow for each platform 161a, 161b to change positions along the x-axis of the table, relative to the pick head 170, in order to align with the pick head with the appropriate die being extracted during the processing of the pre-expanded wafers 126, 726. The combination of the platform's 161 movement along the interior track of track 155 and the Y-axis movement of the pick head carriage 159 along the Y-axis track 153 allows for the pick head to be aligned with any point on the expanded wafer 126, 726 during the extraction of the dies 601.

Embodiments of the die handler 150 may include an XY table that is equipped with one or more Y-axis tracks 153a, 153b (referred generically or together as Y-axis track 153) attached to the XY table. The Y-axis track may allow for the movement of the pick head carriage 159 along the Y-axis track, providing a positioning system for aligning the pick head 170 with the dies 601 of the pre-expanded wafers 126, 726 in conjunction with the movement of the platforms along the X-axis track 155. By coordinating the movement of the platforms 161 in the X-direction and the movement of the pick head carriage 159 in the Y-direction, the pick head 170 may precisely target and extract any die 601 of the pre-expanded wafer 126, 726.

Figure 8B:
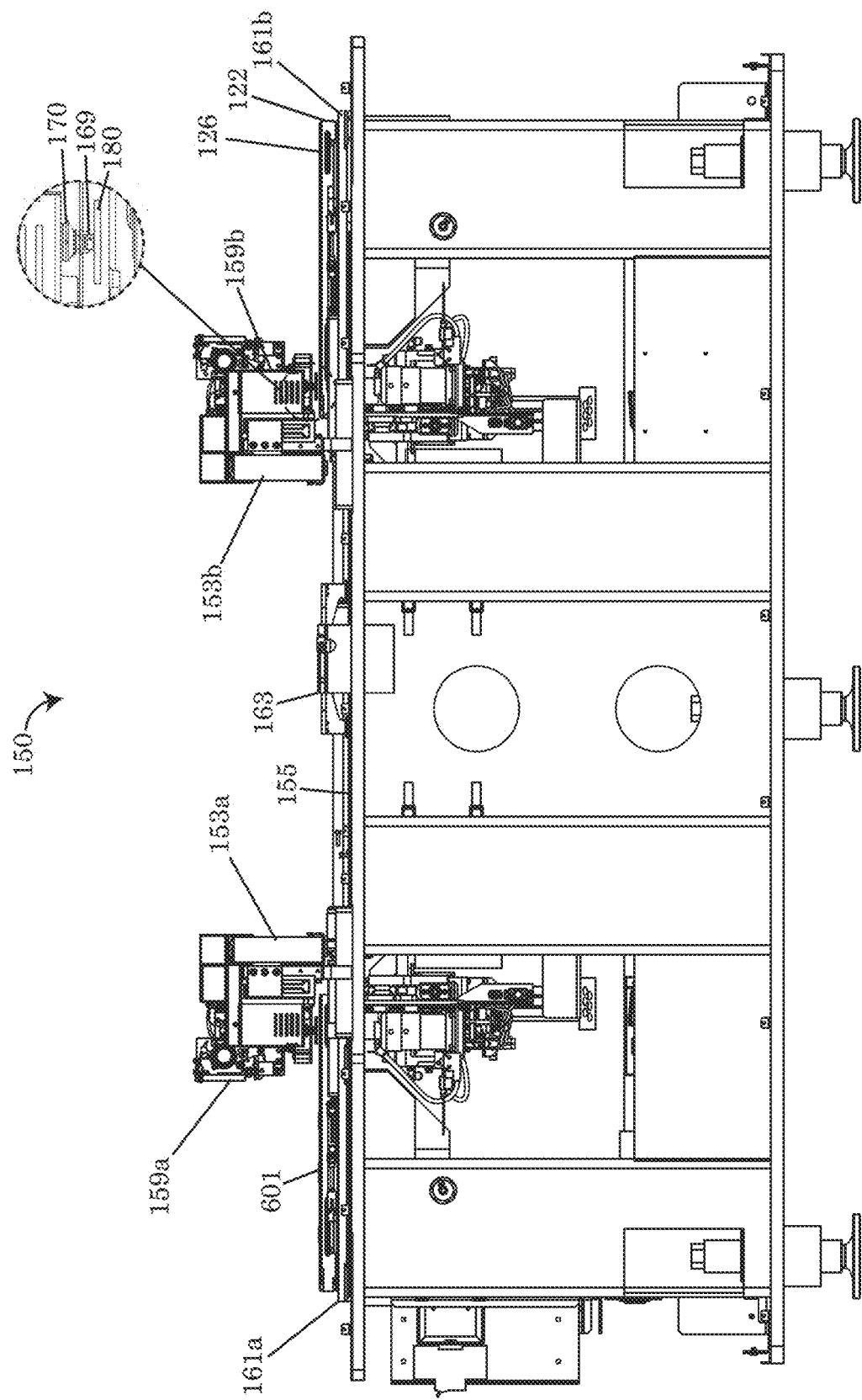
FIG. 8b depicts a front view of an embodiment of a die handler.

Embodiments of the die handler 150 may be programmed using an X, Y coordinate system corresponding to the positions of the expanded wafer 124, 724. Using the programmed coordinate plane, the pick head 170 may select an appropriate nozzle 169 from the nozzle tray, which in some embodiments may be integrated into the puller 163 as shown in FIG. 8a. The pick head 170 may align the nozzle 169 over the die 601 located at the position of the programmed X,Y coordinates using a combination of the platform's 161' movement along the track 155 and the movement of the pick head carriage 159 along the Y-axis track 153. The pick head 170 may use the suction of the pick head 170 to extract the die 601 at the programmed position on the coordinate plane and may deliver the extracted die 180 to a downstream piece of equipment for further processing, such as a pick and place machine.

In some embodiments of the die handler 150, the XY table, the pick head and/or the pick head carriage 159 may be equipped with one or more vision systems 157a, 157b (referred to generically or together as "vision system 157"). The vision systems 157 may include one or more in-line cameras capable of inspecting the extracted dies 180 of the pre-expanded wafer 126, 726 being extracted by the pick head 170. The vision system 157 may allow for three-dimensional viewing of the pre-expanded wafer 126, 726 on two axes in embodiments wherein a single camera may be used. In other embodiments, multiple cameras may be positioned, allowing for viewing of the dies from a plurality of angles. In some instances, the vision system 157 may view the extracted dies 180 from a plurality of axes using a single camera by utilizing one or more optical techniques such as through the use of a prism or mirror.

Figure 9B:
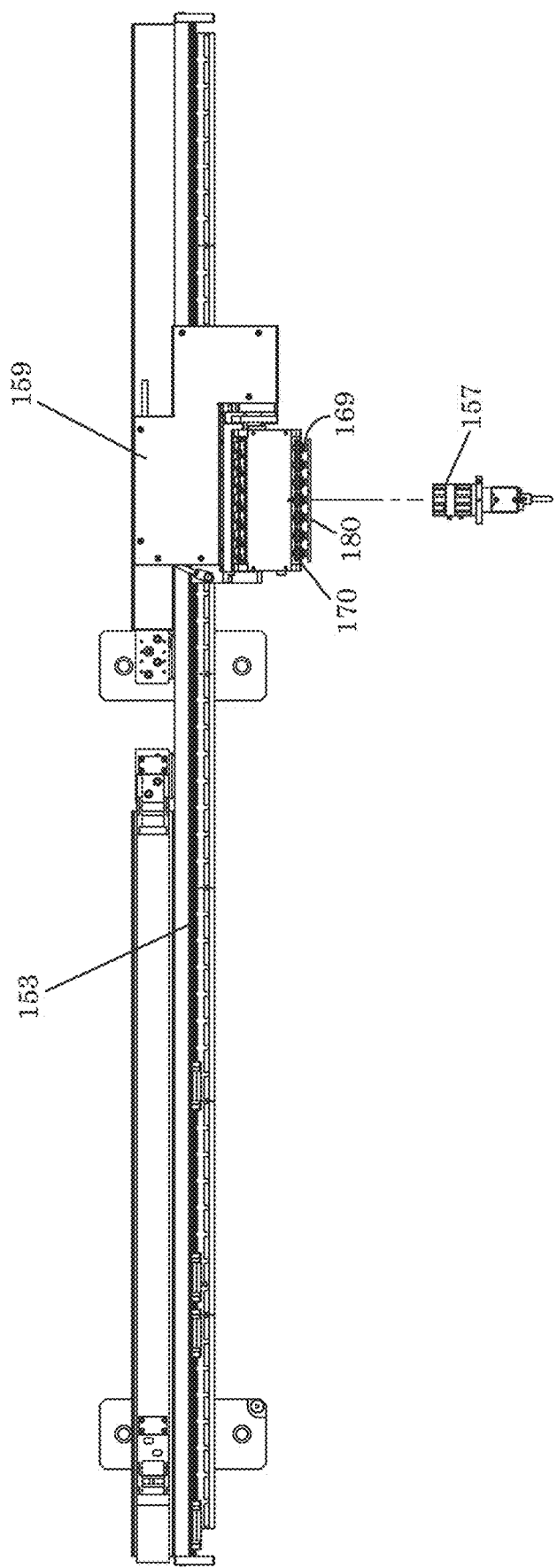
Figure 9C:
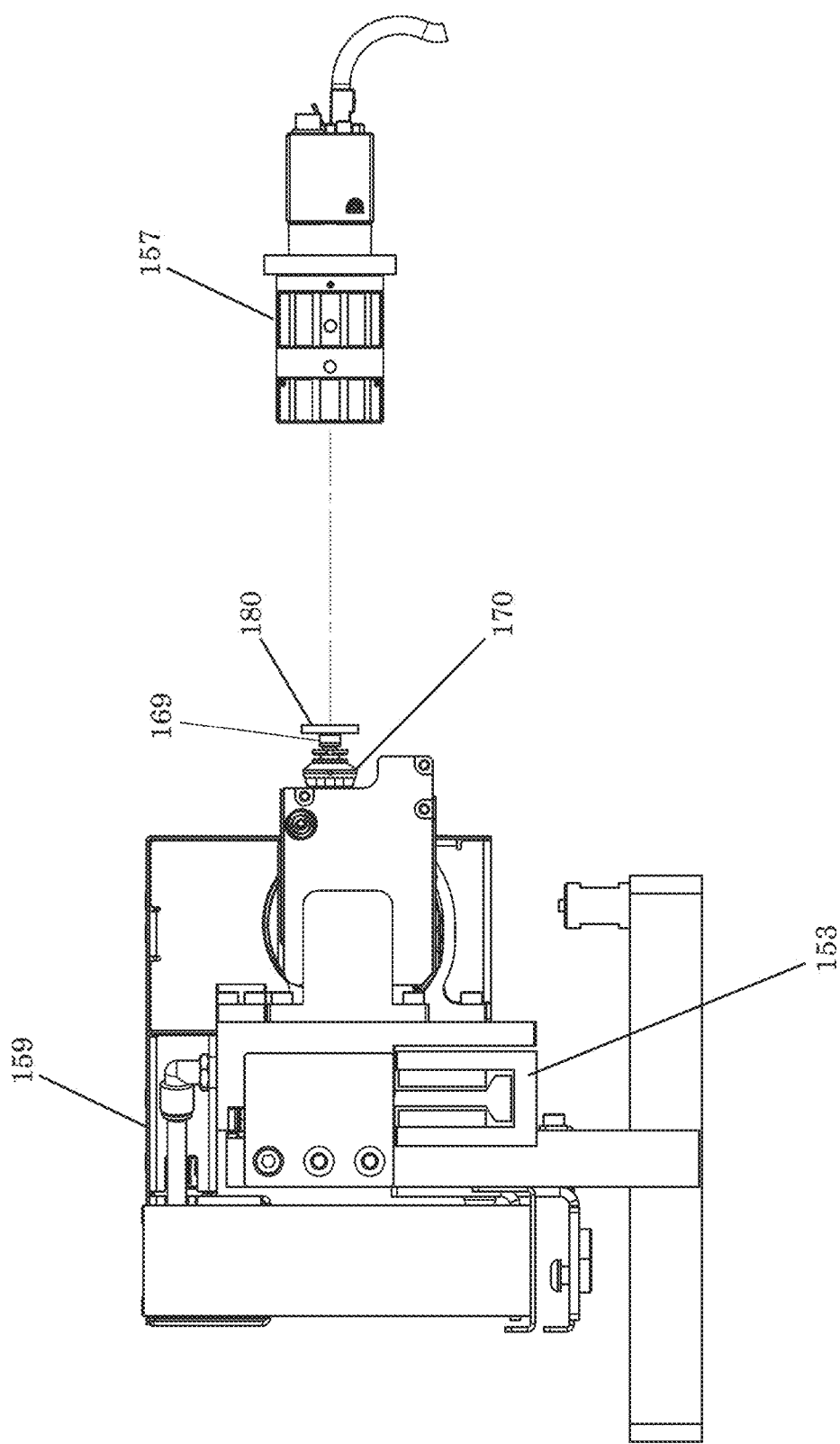
Figure 9D:
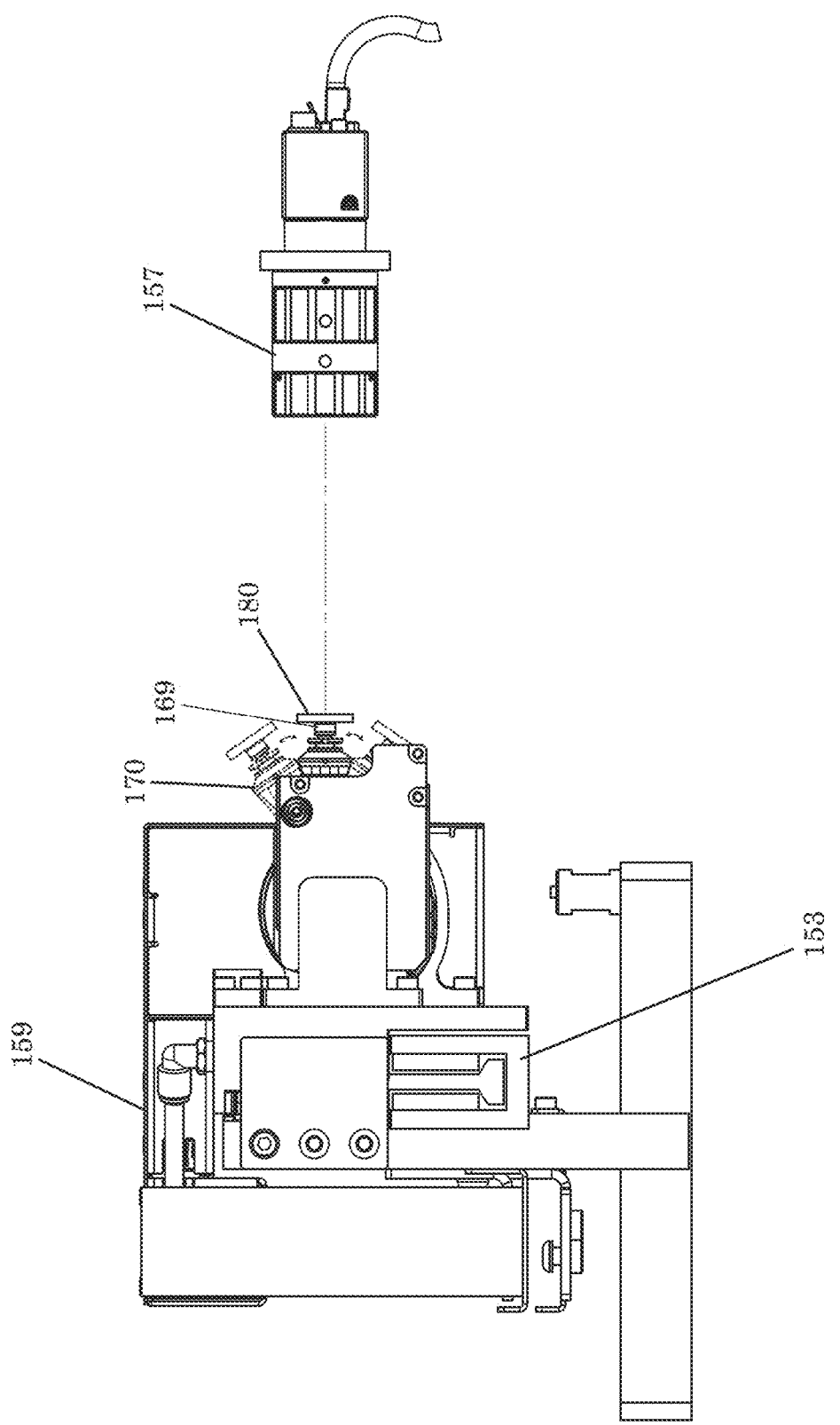
FIG. 9d depicts a side view of an embodiment of a vision system inspecting one or more extracted dies being rotated by a rotating pick head.
Figure 9E:
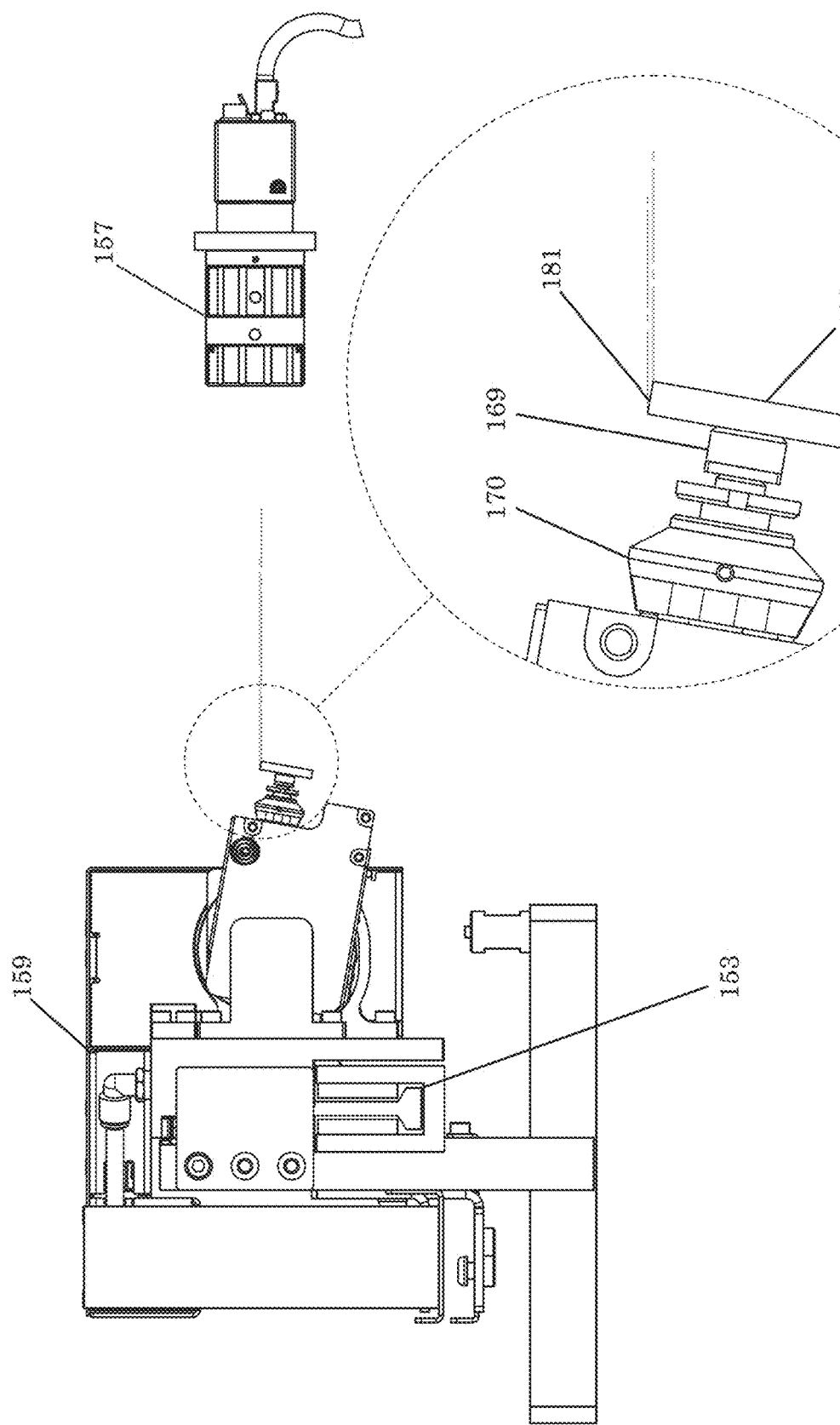
FIG. 9e depicts a side view of an embodiment of a vision system inspecting an edge of an extracted die in a rotated position.

In some embodiments of the die handler 150, pick head 170 may rotate. The rotation of the pick head 170 with the extracted die 180 may allow for the vision system 157 to have a three-dimensional access to the either side of the extracted dies 180 of pre-expanded wafer 126, 726 during the inspection process. By having a pick head 170 that may be capable of tilting or rotating the position of the extracted die 180, the die handler 150 may have the flexibility of viewing the dies 601 extracted by the pick head 170 in both a circuit up (flip chip) orientation and/or a circuit down (die attached) orientation, without having to change operating modes of the die handler 150. In some embodiments, the vision system 157 may view different positions of the extracted die 180 by rotating the pick head 170, which may present the extracted die 180 in different orientations, allowing for a side view or an edge view 181 of the extracted die 180 as shown in FIG. 9d-9e. Embodiments of the vision system 157 may allow for a complete inspection of the boundaries of the extracted dies 180, after extraction of the die 601 from the pre-expanded wafer 126, 726.

As shown in the exemplary embodiment of the die handler 150 in FIGS. 1a-1b and 8a-8b, the die handler 150 may simultaneously process multiple pre-expanded wafers 126, 726 at a time. As shown in the exemplary embodiment, two pre-expanded wafer 126, 726 may be loaded onto separate platforms 161a, 161b wherein the pre-expanded wafers 126, 726. Each of the pre-expanded wafers 126, 726 may be processed independently by separate pick heads, each attached to a separate pick head carriage 159a, 159b. Although the disclosure depicts two pick head carriages 159a, 159b and two platforms 161a, 161b, this should in no way limit the number of pick heads 170, pick head carriages 159 or platforms 161 that may be present in the system 100. Any plurality of elements may be duplicated in the system 100 in order to allow for additional simultaneous processing and extraction of dies 601 from the pre-expanded wafers 126, 726 loaded into the die handler 150. Moreover, because the die handler 150 is an independent module from the wafer handling system 101, the system 100 may simultaneously and concurrently extract and inspect extracted dies 180 removed from a plurality of pre-expanded wafers 126, 726 while the wafer handling system 101 expands the prepared wafers 500 into pre-expanded wafers 126, 726.

Die Handling Method

Figure 10:
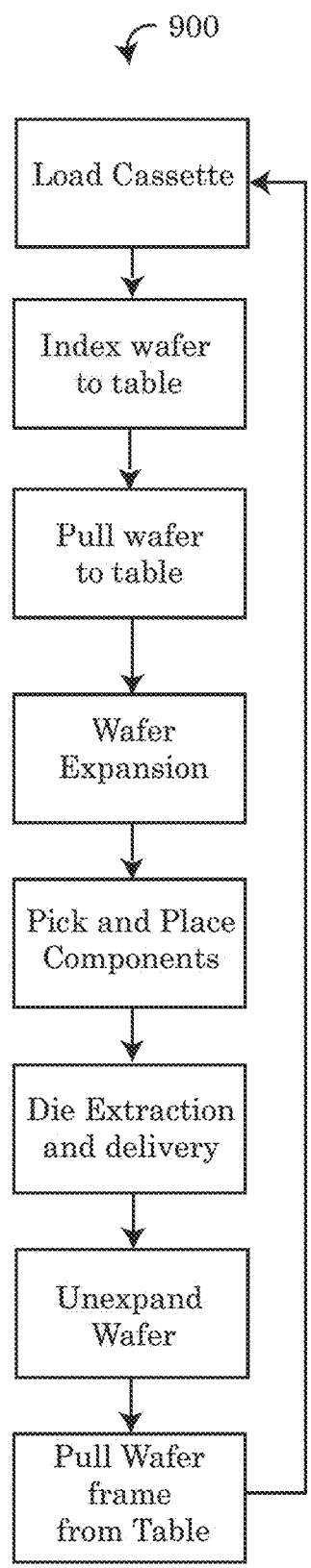
FIG. 10 depicts a flow chart describing the steps for processing a die using an embodiment of a traditional wafer die handling system

Referring to the drawings, FIG. 10 illustrates and embodiment of a method 900 that may be used by a die handling system that may operate in a serial method of processing one or more dies. Unlike the die handling system 100, the system implementing the methods of method 900 does not have a parallel wafer handling system 101. Rather, the indexing, expansion and die extraction are performed in sequence. Wafer expansion and die extraction occur in sequence and cannot be performed concurrently.

Figure 11:
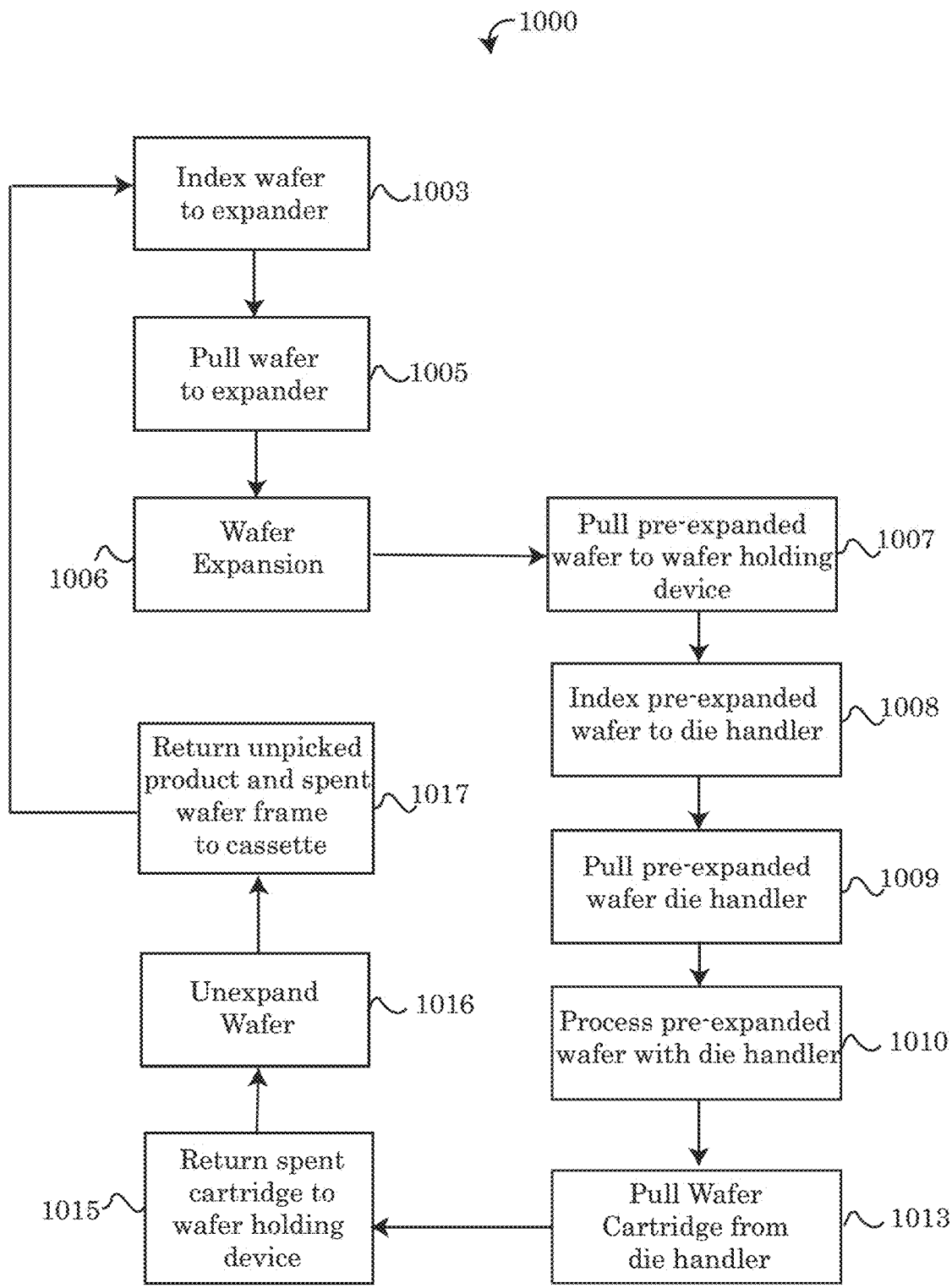
FIG. 11 depicts a flow chart describing the steps for processing a die using an embodiment of a die handling system having a modular wafer handling subsystem.

The embodiment of method 1000 depicted in FIG. 11 describes a work flow of the die handling system 100 of the present disclosure, which may expand one or more prepared wafers 500 in an expander 109 while concurrently performing die extractions from one or more pre-expanded wafers 126, 726 being processed by the die handler 150. In step 1003, the wafer handling system 101 may select a prepared wafer 500 for expansion in an expander 109 in order to convert the prepared wafer 500 into a pre-expanded wafer 126, 726. As part of the selection process, the wafer handling system 101 may index a prepared wafer 500 to the expander 109. The wafer handling system 101 may mark the slot 113 previously occupied by the selected prepared wafer 500 as empty and update the expander 109 as being occupied by the selected prepared wafer 500.

Subsequently, in step 1005, the wafer handling system 101 may perform the process of pulling the prepared wafer 500 from the slot 113 to the expander 109. In step 1005, the wafer handling system may first initiate the elevator 130 comprising the cassette 105 containing the prepared wafer 500 selected for expansion in step 1003. The elevator 130 may initiate the servo motor 307 causing the lead screw 309 of the elevator to turn and thus lift or descend the rear plate 121 attached to the pre-expanded wafer holding device 119, resulting in the cassette 105 to move upward or downward. The elevator 130 may align the slot 113 of the cassette 105 storing the prepared wafer 500 with the wafer table 120. The wafer table arm 127 may move along the track 111 toward the cassette 105 which has been raised or descended to the level of the wafer table 120. As the wafer table arm 127 reaches the slot 113 aligned with the wafer table 120, the wafer table arm 127 may pull the selected prepared wafer 500 for indexing to the expander 109 from the slot 113 and proceed along the track 111 toward the expander 109. The wafer table arm 127 may deliver the selected wafer indexed in step 1003 to the expander 109 for expansion into a pre-expanded wafer 126, 726.

In step 1006, the prepared wafer 500 may be encapsulated into a cartridge 122 and expanded via the expander 109 into a pre-expanded wafer 126, 726 having a surface area that may be greater than the wafer 115 pulled to the expander 109 in step 1005. Embodiments of the expanded wafer 124, 724 may be locked within the encapsulating cartridge 122 between the top and bottom plates of the cartridge 122, forming a pre-expanded wafer 126, 726. Upon completion of the wafer expansion in step 1006, the pre-expanded wafer 126, 726 may be pulled from the expander 109 by the wafer table arm 127. The wafer table arm 127 may proceed along the track 111, in the direction of the pre-expanded wafer holding device 119 and deposit the pre-expanded wafer 126, 726 into a slot of the pre-expanded wafer holding device 119. The wafer handling system 101 may select an open slot of the wafer handling device 119 and initiate the elevator 130 to raise or lower the pre-expanded wafer holding device 119 to align the open slot with the wafer table 120, allowing for the wafer table arm 127 to pull the pre-expanded wafer 126, 726 into the pre-expanded wafer holding device 119 slot selected by the system.

In step 1008, a pre-expanded wafer 126, 726 pulled to the pre-expanded wafer holding device 119 in step 1007 may be indexed for die extraction by the die handler 150. The system 100 may amend the queue of pre-expanded wafers 126, 726 in the pre-expanded wafer holding device 119, in order to account for an empty space reserved for the pre-expanded wafer scheduled to be removed from the pre-expanded wafer holding device 119 and pulled onto the platform 161 of the XY table of the die handler 150. In step 1009, the pre-expanded wafer 126, 726 indexed by the system 100 for being pulled to the die handler 150 may be pulled to a platform 161 of the die handler 150 by the puller 163.

The action of pulling the pre-expanded wafer 126, 726 indexed in step 1008 to the platform 161 may occur by aligning the slot of the pre-expanded wafer holding device 119 with the platform 161 on the XY table. The alignment between the platform 161 and the slot of the pre-expanded wafer holding device 119 may be achieved by initiating the elevator 130 and either lifting or lowering the rear plate 121 attached to the elevator 130 and the pre-expanded wafer holding device 119, until the slot holding the indexed wafer is aligned with the platform 161. The platform 161 may slide along the X-axis created by the track system 155. The platform 161 may slide over to abut the slot of the pre-expanded wafer holding device 119. The puller 163 may also slide along the track 155, remove the pre-expanded wafer 126, 726 from the pre-expanded wafer holding device 119 and affix the pre-expanded wafer 126, 726 to the platform 161.

Embodiments of the platform 161 secured to the cartridge of the pre-expanded wafer 126, 726 may move in the opposite direction away from the pre-expanded wafer holding device 119 along track 155 toward the pick head 170 housed within the pick head carriage 159. In step 1010, the die handler 150 may begin processing the pre-expanded wafer 126, 726 by extracting one or dies 601 from the pre-expanded wafer 126, 726 via the pick head. In some embodiments, the pick head 170 may be aligned with the nozzle tray in order to select a nozzle 169 that may be attached by the pick head 170 for extraction of the dies 601. The puller 163 may move along the track system 155 until aligned with the pick head carriage and more specifically, aligned underneath the Y-axis track 153, within suction distance of the pick head 170. Once aligned with puller, the pick head carriage may slide along the Y-axis track 153 until the pick heads 170 is positioned over the desired nozzle 169. The pick head 170 may lift and/or attach the nozzle 169 from the nozzle tray and proceed with the extraction of the dies 601 from the pre-expanded wafer 126, 726 using the nozzle 169 in some embodiments.

Once the nozzle 169 may have been selected, the nozzle tray may slide along the track system 155 away from the pick head 170, while the platform 161 may move along the track system 155 until placed in a pre-programmed position aligning a first die selected by the system 100 for processing with the Y-axis track 153. The pick head 170 may move along the Y-axis track 153 via movement of the pick head carriage 159, until the pick head 170 is aligned in with pre-programmed X-Y coordinate position. The pick head 170 may descend toward the die 601 in the position below the pick head 170, extracting the selected die 601 from the pre-expanded wafer 126, 726 positioned below. The pick head 170 may continuously be aligned and realigned with each die 601 via the movement of the platform 161 and the pick head carriage 159 until all selected dies 601 have been extracted.

The processing step 1010 may continue in some embodiments by inspecting the extracted dies 180 using the in-line vision system 157 as demonstrated in FIGS. 9a-9e. The cameras of the vision system 157 may ensure that the extracted dies 180 are extracted as intended by the system 100 and that each of the extracted dies 180 are not damaged. The pick head 170 may tilt the extracted dies 180 in different directions, as shown in FIGS. 9d-9e, allowing for the vision system 157 to inspect the die in three dimensional space. During the inspection, the vision system 157 may observe the exposed face of the each extracted die 180 positioned toward the vision system 157 after the die 601 is extracted. The vision system 157 may also view each of the edges of the extracted die 180 positioned toward the vision system 157 as the pick head 170 rotates from one position to another. The vision system 157 may identify defects on the edges of the extracted die 180. Once inspection by the vision system 157 is completed, the pick head 170 may deliver the extracted die 180 to a downstream piece of processing equipment that may further process the die 601. For example, the pick head 170 may transfer the extracted die 180 to a pick and place machine. Embodiments of the die handler 150 may continue to extract each of the dies 601 from the expanded wafer 124, 724 until the pre-expanded wafer 126, 726 is exhausted, leaving behind an empty cartridge 122 and frame 117. In step 1013, the empty cartridge 122 containing the frame 117 may be moved via the puller 163 back to the empty slot of the wafer holder device 119.

In step 1015, the elevator 130 may raise the slot containing the spent cartridge 122 and frame 117 upward, back into alignment with the wafer table 120. The wafer table arm 127 may pull the empty cartridge 122 and frame 117 from the pre-expanded wafer holding device 119 along track 111 back toward the expander 109. Subsequently, the expander 109 may, in step 1016 un-expand the cartridge 122, opening the cartridge 122. In some embodiments, the expander may keep the cartridge within the expander 109 for the next pre-expanded wafer 126, 726 to be formed. Upon completing the un-expansion of the cartridge 122, the expended wafer frame 117 may, in step 1017 be returned to the cassette 105. The wafer table arm 127 may pull the frame 117 from the expander 109 toward the cassette 105. The elevator 130 may align an empty slot of the cassette 105 with the wafer table 120. Once aligned with the wafer table 120, the wafer table arm 127 may deposit the empty frame 117 into the empty slot 113, allowing for the frame 117 to be used in conjunction with another wafer 115 that may be loaded into the cassette.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A die handling system comprising:
   a first cassette configured to store prepared wafers comprising a wafer of a first configuration;
   an expander configured to expand the wafers of the first configuration into a first pre-expanded wafer;
   a pre-expanded wafer holding device configured to store the first pre-expanded wafer received from the expander;
   a die handler separately located from the expander and the pre-expanded wafer holding device, the die handler comprising a pick head configured to extract one or more dies from the first pre-expanded wafer;
   a second cassette configured to store second prepared wafers comprising a wafer of a second configuration, wherein properties of the second configuration are different from properties of the first configuration; and
   a second pre-expanded wafer holding device configured to receive a second pre-expanded wafer from the expander.

2. The die handling system of claim 1, wherein the first pre-expanded wafer is maintained in a first cartridge comprising the wafer of the first configuration positioned between a top plate and bottom plate of the first cartridge.

3. The die handling system of claim 1, wherein the first pre-expanded wafer and the second pre-expanded wafer are stored in a pre-oriented position in the first pre-expanded wafer holding device or second pre-expanded wafer holding device.

4. The die handling system of claim 1 further comprising:
   a first elevator attached to the pre-expanded wafer holding device;
   a second elevator attached to the second pre-expanded wafer holding device; and
   the die handler is connected to both the first elevator and the second elevator.

5. The die handling system of claim 1, wherein the pick head of the die handler concurrently extracts one or more dies from the first pre-expanded wafer while the expander expands the wafers or the wafers of the second configuration into a second pre-expanded wafer.

6. The die handling system of claim 1, further comprising:
   a camera attached to the die handler, wherein the camera has a three dimensional view of each extracted die of the first pre-expanded wafer.

7. The die handling system of claim 6, wherein the three-dimensional view of the camera allows for a side view and an edge view of the one or more dies extracted from the first pre-expanded wafer.

8. The die handling system of claim 6, wherein the pick head rotates and presents each extracted die of the first pre-expanded wafer to the camera.

9. The die handling system of claim 1, wherein the pick head is rotatable.

10. A die handling method comprising the steps of:
    pulling a prepared wafer comprising a wafer of a first configuration from a cassette to an expander;
    expanding the wafer to a pre-expanded wafer;
    storing the pre-expanded wafer in a pre-expanded wafer holding device;

pulling the pre-expanded wafer from the pre-expanded wafer holding device to a table of a die handler that is separately located from the expander and the pre-expanded wafer holding device;

extracting one or more dies from of the pre-expanded wafer;

pulling a second prepared wafer comprising a second wafer of a second configuration from a second cassette to the expander, wherein the second wafer has a different configuration than the wafer of the first configuration; and expanding the second wafer to a second pre-expanded wafer.

11. The method of claim 10, further comprising the steps of:

storing the second pre-expanded wafer in a second pre-expanded wafer holding device; and pulling the second pre-expanded wafer from the second pre-expanded wafer holding device to the die handler.

12. The method of claim 10, wherein the step of expanding the prepared wafer into a pre-expanded wafer further comprises:

preparing a cartridge comprising a top plate, bottom plate and the prepared wafer;

layering the prepared wafer between the top plate and bottom plate of the cartridge;

expanding the wafer by compressing the top plate and bottom plate together; and locking the top plate and bottom plate together, creating the pre-expanded wafer.

13. The method of claim 10, wherein the step of extracting one or more dies of the pre-expanded wafer and the step of expanding the second prepared wafer to a second pre-expanded wafer occur simultaneously.

14. The method of claim 10 further comprising the step of:

inspecting, by a vision system attached to the die handler, the one or more dies extracted from the pre-expanded wafer.

15. The method of claim 14, wherein the vision system provides a three dimensional view of the one or more dies extracted from the pre-expanded wafer.

16. The method of claim 14, wherein the inspecting step includes viewing, by a camera of the vision system, a side view or an edge view of the one or more dies extracted from the pre-expanded wafer.

17. The method of claim 10, wherein the step of storing the pre-expanded wafer in a pre-expanded wafer holding device further comprises the step of:

rotating the pre-expanded wafer into a pre-orientated position; and placing the pre-expanded wafer into the pre-expanded wafer holding device in the pre-orientated position.

18. The method of claim 10, further comprising the steps of:

storing the second pre-expanded wafer in a second pre-expanded wafer holding device;

pulling the second pre-expanded wafer from the second pre-expanded wafer holding device to the table of the die handler; and extracting one or more dies of the second pre-expanded wafer while concurrently extracting one or more dies from the first pre-expanded wafer.

\* \* \* \* \*